(12) United States Patent
Sanchez

(10) Patent No.: US 6,629,638 B1
(45) Date of Patent: Oct. 7, 2003

(54) ELECTRO-OPTIC SYSTEM CONTROLLER AND METHOD OF OPERATION

(75) Inventor: Jorge Sanchez, Poway, CA (US)

(73) Assignee: Ceyx Technologies, San Diego, CA (US)

(*) Notice: Subject to any disclaimer, the term of this patent is extended or adjusted under 35 U.S.C. 154(b) by 349 days.

(21) Appl. No.: 09/724,692

(22) Filed: Nov. 28, 2000

Related U.S. Application Data

(63) Continuation-in-part of application No. 09/517,375, filed on Mar. 2, 2000, which is a continuation-in-part of application No. 09/472,709, filed on Dec. 24, 1999, which is a continuation-in-part of application No. 08/988,865, filed on Dec. 11, 1997, now Pat. No. 6,028,423, application No. 09/724,692, filed on Nov. 28, 2000.

(60) Provisional application No. 60/173,056, filed on Dec. 24, 1999.

(51) Int. Cl.[7] .................................................. G06K 7/10
(52) U.S. Cl. ........................................ 235/454; 235/455
(58) Field of Search ............................... 235/454, 455, 235/462.01; 372/29.01, 38.1, 38.07, 38.09, 29.015; 250/214 R, 214 A, 214 C, 214 DC, 252.01

(56) References Cited

U.S. PATENT DOCUMENTS

| | | | |
|---|---|---|---|
| 4,558,465 A | | 12/1985 | Siegel et al. |
| 4,995,105 A | * | 2/1991 | Wechsler ............... 372/29.014 |
| 5,103,453 A | | 4/1992 | Kebabian et al. |
| 5,410,145 A | | 4/1995 | Coroy |
| 5,463,461 A | | 10/1995 | Horiuchi et al. |
| 5,514,864 A | * | 5/1996 | Mu-Tung et al. ........... 250/205 |
| 6,057,678 A | * | 5/2000 | Tagiri et al. .................. 324/96 |
| 6,384,590 B1 | * | 5/2002 | Kikuchi et al. .......... 324/76.36 |

FOREIGN PATENT DOCUMENTS

| | | |
|---|---|---|
| EP | 0 344 091 | 11/1989 |
| GB | 2 192 510 | 1/1988 |
| WO | WO 99/34542 | 7/1999 |

* cited by examiner

*Primary Examiner*—Karl D. Frech
*Assistant Examiner*—April A. Nowlin
(74) *Attorney, Agent, or Firm*—Brown Martin Haller & McClain LLP

(57) ABSTRACT

The present invention provides an apparatus and methods to control and initialize an Electro-Optical System. The apparatus consists of a controller that includes all of the necessary electronics needed to drive the laser, monitor its operation with the use of measurement circuits, maintain the laser parameters operating within acceptable limits over temperature and device variations and also control operation of related circuits such as signal amplifiers and Host Computer Interface. The methods consist of an automated factory calibration process that allows the laser to meet strict requirements for precision and reliability. The methods also consist of a process for continuously monitoring and adjusting the laser for changes due to temperature or aging by measuring monitored laser performance variables, utilizing the appropriate models and adjustment techniques and finally performing the adjustments while the laser is in use, that is, without the need to disconnect the laser from the system.

46 Claims, 9 Drawing Sheets

FACTORY CALIBRATION PROCESS

950

POWER UP CALIBRATION AND INITIALIZATION

ELECTRO-OPTIC SYSTEM CONTROLLER AND METHOD OF OPERATION

CROSS-REFERENCES TO RELATED APPLICATIONS

This is a continuation-in-part of application Ser. No. 09/517,375, filed on Mar. 2, 2000, which is a continuation-in-part of application Ser. No. 09/472,709 filed on Dec. 24, 1999, which is a continuation-in-part of application Ser. No. 08/988,865, filed on Dec. 11, 1997, now U.S. Pat. No. 6,028,423. This application also claims priority under 35 U.S.C. 119(e) to provisional U.S. Patent Application No. 60/173,056 filed Dec. 24, 1999.

BACKGROUND OF THE INVENTION

The present invention relates to a logic system based controller and more specifically a controller that utilizes state machines, logic and/or a microprocessor for an electro-optic system.

Electro-optic systems are known in the art for providing an interface between electronic and optically-based systems. Such electro-optic systems are used in a variety of applications including telecommunications, remote sensing, medical devices, and in other fields as well.

FIG. 1a illustrates a conventional electro-optic system 100 for use with one of the aforementioned systems. The electro-optic system 100 includes a laser 110 and an analog bias controller 120. Typically, an electronic system produces a modulating signal which is combined 112 with a laser bias current $I_{DC}$. The combined signal is injected into the laser 110 which produces a modulating optical output signal, $P_O$, that typically is an intensity modulated signal in which the light intensity varies as a function of the amplitude of the modulating signal. In analog systems, the bias current $I_{DC}$ is selected such that it biases the laser 110 at an operating point where the laser output $P_O$ exhibits a linear relationship to the input bias $I_{DC}$ (herein referred to as the laser's transfer function). The modulating signal varies the bias point above and below this operating point thereby producing a corresponding change in the intensity of the output power, $P_O$, of the laser 110.

Continuing with FIG. 1, the laser 110 may include a monitoring photodiode (not shown) either separate or integrated into the same package with the laser 110. The monitoring photodiode produces a photodiode current $I_{PD}$ indicative of the laser output power $P_o$. The photodiode current $I_{PD}$ is supplied to an analog bias controller 120 which includes circuitry designed to measure the photodiode current $I_{PD}$ and to return the laser bias $I_{DC}$ to a predefined current level.

FIG. 1b illustrates a graph showing three transfer functions of a laser at three operating temperatures T1, T2, T3. The graph illustrates laser output power $P_O$ along the y-axis, and laser bias current $I_{DC}$ along the x-axis. The first trace 152 illustrates the laser's transfer function at a first operating temperature $T_1$. The second trace 154 and the third trace 156 similarly illustrate the laser's transfer function at a second and a third operating temperature, $T_2$ and $T_3$, respectively. Each of the transfer functions 152, 154, and 156 also include a corresponding threshold operating point $I_{th1}$, $I_{th2}$, and $I_{th3}$, respectively. The threshold operating points $I_{th1}$, $I_{th2}$, and $I_{th3}$, indicate the laser bias current level $I_{DC}$ at which the laser produces appreciable output power. As can be seen, a laser's threshold operating point varies greatly with operating temperature. A change in the operating temperature of the laser shifts the transfer function laterally along the x-axis.

A shift in the operating temperature can produce a significant change in the laser output power. For example, a laser bias current $I_{DC}$ selected to bias the laser at operating point $I_{Q1}$ produces a laser output power $P_{T1}$ in the center 162 of the linear region of the transfer function 152. At operating point $I_{Q1}$, The laser will operate as intended to produce a substantially linearly varying output power $P_O$ when excited by a modulating signal. If the operating temperature of the laser operating temperature changes to $T_2$, the laser output power $P_{T2}$ for the same bias current $I_{Q1}$ drops significantly as shown by operating point 163. In this case, the linear operating region of the laser and electro-optic system 100 is limited to the linear region below operating point 163, in the case of negative current swings below $I_{Q1}$. The analog bias controller 120 contains circuits to compensate for change in temperature, but with a limited degree of accuracy. The analog bias controller 120 also requires manual adjustments, has limited control capabilities, and is subject to significant temperature drift.

In view of the aforementioned inadequacies of the prior art, the need exists for a new system and method for controlling an electro-optic system over varying temperatures of operation.

SUMMARY OF THE INVENTION

It is an advantage of the present invention to provide a system and method for controlling an electro-optic system by which the threshold operating point of the system gains and other parameters can be accurately established and the laser transfer function controlled over a variety of different operating temperatures of a laser module.

It is another advantage to provide a system for subtracting errors due to dark current and aging of a laser-monitoring photodiode.

It is yet another advantage to provide a system for driving a laser utilizing both a low frequency circuit to drive DC current in addition to a high frequency circuit for driving a high frequency AC/DC signal to set the operating point of a laser.

A further advantage is to provide a system and method for calibrating and initializing the electro-optic system upon each power up of the system.

It is another advantage to provide a system for continuously monitoring and adjusting parameters of an electro-optic system while the system is fully operational.

Still another advantage of the present invention further is to provide a system and method for enabling a link characterization process to be performed between two electro-optic systems.

Electro-Optic System Controller

In an exemplary embodiment, the present invention is an electro-optic system for driving a laser, monitoring the laser operation, and maintaining the laser parameters within acceptable limits over temperature and device variations. The electro-optic system of an exemplary embodiment includes a signal input coupled to a pre-amplifier via a test system switch (TSS). The output of the preamplifier is fed into a combiner and coupled to a laser module input. A laser module of an exemplary embodiment includes a laser bias input, a laser output, a temperature sensor output, and a monitoring photodiode sensor output. In other embodiments, the laser module may further include a power sensor and a cooler/heater component. The test system switch, the preamplifier and the laser module are controlled by a controller circuit.

The controller circuit of an exemplary embodiment may be a digital processor, a microprocessor, or an ASIC device that is capable of generating control data. The processor of the exemplary embodiment includes a communication port that may be connected to an external host computer. The processor of the exemplary embodiment further includes memory or an input for connection to a memory component. In other embodiments of the present invention the processor may include a port for storing/receiving digital data to/from an external source.

The processor controls the test system switch utilizing switch control lines. In an exemplary embodiment, the test system switch may connect one of a data signal, a signal generated from a signal generator, or a reference ground to the input of the preamplifier. The signal generator is controlled by the processor. The test system switch of an exemplary embodiment also includes a switched or dedicated line for connecting a coded input signal to a code detector of the controller circuit. The code detector identifies the reception of an encoded signal received by the electro-optic system and outputs coded data to the processor.

The preamplifier of an exemplary embodiment includes an amplifier connected to the switched input from the test system switch, a high frequency voltage variable resistor, and a high frequency voltage controlled current source (HF-VCCS) that is connected to the signal input of the laser. The preamplifier is coupled to the processor and may have its gain and offset characteristics changed by means of a dual digital to analog converter (DAC) that accepts digital control signals from the processor. The dual DAC of an exemplary embodiment dedicates one DAC for adjusting the gain of the preamplifier and a second DAC for adjusting the offset of the preamplifier.

The driving signal to the laser input of an exemplary embodiment is the combination of a high frequency DC/AC signal current $I_S$ and a low frequency laser bias current $I_L$. The biasing current $I_L$ is generated by the controller of the electro-optic system utilizing a low frequency voltage controlled current source controller by the processor by means of a bias adjust DAC. The controller of an exemplary embodiment may further include digital to analog converters connected to the processor for controlling the wavelength of the laser, and for controlling other laser components such as a cooler/heater.

The controller of an exemplary embodiment of the present invention further provides circuitry for monitoring the laser module components including the photodiode and the temperature sensor, the preamplifier, and also includes other signals generated by the controller such as the low frequency bias current $I_L$. In an exemplary embodiment, a voltage signal is provided by the temperature sensor that is indicative of the real-time temperature of the laser module. This temperature voltage signal is fed into a sensing amplifier of a package of sensing amplifiers. The outputs of the sensing amplifiers are connected to a multiplexer that is coupled to the processor via an analog to digital converter. Other signals are also supplied to the processor by means of the sensing amplifiers including a test signal from the high frequency VCCS of the preamplifier and a test signal from the low frequency VCCS. The photodiode of the laser module of the exemplary embodiment includes a photodiode current output signal that is connected to a photodiode amplifier in the controller circuit. The amplifier is controller by the processor via a dual digital to analog converter that includes an offset adjust DAC and a gain adjust DAC. The output of the photodiode amplifier is connected to an input of the multiplexer. The multiplexer of the exemplary embodiment also includes additional inputs for monitoring the various voltages utilized by the electro-optic system.

Factory Calibration

An exemplary embodiment of the present invention provides a factory calibration process for calibrating the laser module system. Test equipment utilized for the laser calibration is connected from the laser output to the laser drive control system. In one embodiment, the testing equipment may consist of an external optical power meter instrument having an I/O interface to a host computer. Once the testing equipment is connected to the laser module system, the dark current of the laser module photodiode is determined by first setting the gain of the laser preamplifier to nominal. The Test System Switch (TSS), which is connected to the input of the laser preamplifier, is connected to a circuit ground utilizing a control signal from the microprocessor of the electro-optic system.

The calibration process of the exemplary embodiment continues by turning off the DC bias for the laser by supplying an appropriate digital word to a bias adjust digital to analog converter (DAC). The analog signal produced by the bias adjust DAC turns off the current normally generated by the Low Frequency Voltage Controlled Current Source (VCCS). The offset voltage of the preamplifier is canceled by adjusting an offset adjust DAC while monitoring the offset utilizing a measurement of the voltage across a resistor of the high frequency VCCS. The dark current of the laser photodiode is calibrated to avoid errors as the laser photodiode changes with temperature and aging. If the laser has no current drive, then the output light power of the laser is zero, that is, no light is coupled into the monitoring laser photodiode. The parasitic dark current $I_D$ is defined as the current that flows through the laser photodiode for a no-light output condition. The measured dark current is recorded and utilized to compensate the system measurements.

The threshold currents of the laser, and corresponding laser photodiode currents are determined in the next steps of the exemplary calibration method. The DC bias current to the laser $I_L$ is incremented gradually by changing the input of the bias adjust DAC utilizing the microprocessor control lines. The change to the input of the bias adjust DAC changes the current output of the low frequency VCCS on the DC bias path. At the same time, laser power $P_L$ is read with the external optical power meter, and the microprocessor computes the slope of the transfer characteristic $dP_L/dI_L$. In the next step of the exemplary embodiment, the laser bias current $I_L$ is set to a threshold $I_{LTH}$ by setting the bias current $I_L$ to a value at which the derivative $dP_L/dI_L$ stops changing. This step sets the threshold $I_{LTH}$ in the linear region of the laser characteristic. Once the threshold $I_{LTH}$ is determined, the laser power at threshold $P_{LTH}$ is read utilizing the optical power meter and recorded by the microprocessor.

The calibration method of the exemplary embodiment continues by measuring the laser photodiode current $I_{P1}$ under the above threshold conditions. Specifically, the threshold values of the laser photodiode current $I_{P1T}$ are measured and recorded via a path through a photodiode amplifier to a MUX and analog to digital (A/D) converter that is connected to the microprocessor. The laser threshold current $I_{LTH}$ is measured and recorded via a path through a measurement resistor to the sensing amplifiers, through the MUX and A/D converter, and to the microprocessor. The recorded value of the laser photodiode threshold current $I_{P1T}$ is adjusted utilizing the value of the dark current $I_D$. A precision method for measuring the laser bias current $I_L$ starts with the sensing of a voltage across a resistor of the low frequency VCCS utilizing a sensing resistor. The sensed voltage is routed through an amplifier of the sensing amplifiers to the multiplexer, and is converted to a digital word and routed to the microprocessor by the A/D converter. The temperature of laser module is read and recorded at the threshold values so that the microprocessor may associate a given temperature to the laser threshold current $I_{LTH}$, to a photodiode threshold current $I_{P1T}$, and to photodiode dark current $I_D$.

Continuing with the calibration process of an exemplary embodiment, the input to the laser preamplifier is disconnected from circuit ground and connected to a voltage reference of a signal generator utilizing the test system switch. The voltage reference utilized in the calibration process is a precision full-scale reference voltage $V_{REF}$ that is applied to the input of the laser preamplifier. The gain $G_1$ of the laser preamplifier is incremented while reading the power output $P_L$ of the laser utilizing the optical power meter. The gain $G_1$ of the laser preamplifier is incremented by the microprocessor by applying an appropriate digital word to a gain adjust DAC. The gain adjust DAC, in turn, applies a voltage to the high frequency voltage variable resistor, which then changes the gain $G_1$ of the laser preamplifier. The gain adjust DAC is incremented to determine a full power gain $G_F$ needed to obtain full-scale laser power $P_{LMI}$. The maximum current $I_{PM}$ through the laser photodiode is determined for the full-scale laser power $P_{LMI}$ condition.

The effective photodiode responsivity $R_{eff}$ of the combination of the laser module and the laser photodiode is calculated and recorded. The factory calibration process of the exemplary embodiment is completed by preparing drift compensation models, storing the models in a processor memory, and disconnecting the test equipment utilized for the laser calibration.

Power Up Calibration and Initialization

An exemplary embodiment of the present invention provides a power up calibration process for calibrating the laser module system. Upon power up of the laser module system, the preamplifier gain is set to the to the full power gain $G_{F1}$ obtained during factory calibration, needed to obtain full-scale laser power $P_{LMI}$ gain. The input of the laser preamplifier is connected to circuit ground using the test system switch. In a next step, the DC bias for laser is turned off by supplying an appropriate digital word to a bias adjust digital to analog converter (DAC). The offset voltage of the preamplifier is canceled by adjusting an offset adjust DAC while monitoring the offset utilizing a measurement of the voltage across a resistor of the high frequency VCCS. The dark current $I_D$ from the laser photodiode is measured and recorded. The temperature T of laser module is then measured and recorded.

The power up calibration and initialization process of an exemplary embodiment continues by determining the laser power threshold. The DC bias current $I_L$ to the laser is measured concurrently with the laser photodiode current $I_{P1}$. The microprocessor then utilizes the recorded values from the above measurements to compute the laser power $P_L$. The DC bias current $I_L$ is set to threshold by selecting a point at which $dP_L/dI_L$ stops changing. In a next step of the exemplary embodiment, the laser threshold power $P_{LTH}$ is determined by reading the laser photodiode threshold current $I_{PTH}$ and computing and recording the corresponding laser threshold power $P_{LTH}$. The laser threshold current $I_{LTH}$ and the photodiode threshold currents $I_{P1T}$ are also recorded. The process of determining the laser power threshold is completed by determining and recording the threshold temperature of laser module $T_{TH}$.

The exemplary power up calibration process continues by calibrating the system gain. Utilizing the test system switch (TSS), the laser preamplifier input is disconnected from the circuit ground, and is connected to a precision full-scale reference voltage $V_{REF}$ of the signal generator. A photodiode current $I_{PM}$ resulting from the application of the reference voltage $V_{REF}$ is measured, and the corresponding laser power output $P_L$ is determined. In a next step, the microprocessor compensates for gain errors of the laser module. The gain $G_1$ of the laser preamplifier is incremented while determining the laser power output $P_L$ with laser photodiode measurements. The gain $G_F$ needed to obtain full scale output laser power $P_{LM}$ is determined. The TSS path to the laser preamplifier is switched from the reference voltage $V_{REF}$ to circuit ground. The DC bias current is set to an a "Q point" current $I_{LQ}$, defined as an operating point above the threshold current, using the DC bias path measurement circuit. The microprocessor of the Electro-Optic System computes drift compensation for the above measured parameter. The power up calibration and initialization is completed by connecting the input of the preamplifier to the signal driving the laser.

Electro-Optic System Monitoring

In an exemplary embodiment, the Electro-Optic System enters a monitor phase where drift compensation is implemented on a continuous basis without having to disconnect the Electro-Optic System from the input signal. Adjustments to the system parameters such as laser DC bias or system gain are made as needed to compensate for temperature changes. The drift compensation process determines the adjustments with the use of drift models and then changes the system parameters, as needed, utilizing very gradual steps that emulate analog drift.

BRIEF DESCRIPTION OF THE DRAWINGS

The present invention will be better understood from the following detailed description of a preferred embodiment of the invention, taken in conjunction with the accompanying drawings in which like reference numerals refer to like parts and in which:

FIG. 1b illustrates a transfer function of the laser shown in FIG. 1a;

DESCRIPTION OF THE PREFERRED EMBODIMENT

I. General Overview

Figure 1A:
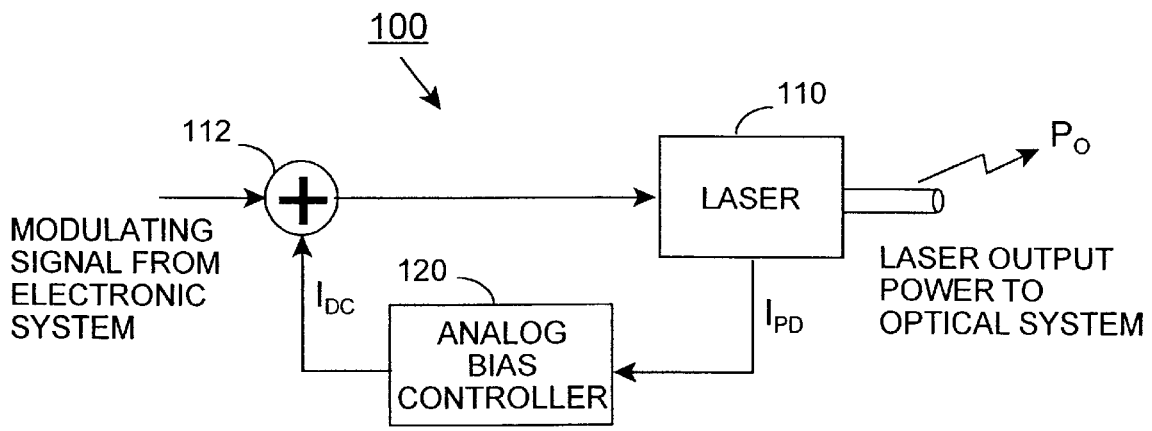
FIG. 1a illustrates a conventional electro-optic communication system.
Figure 1B:
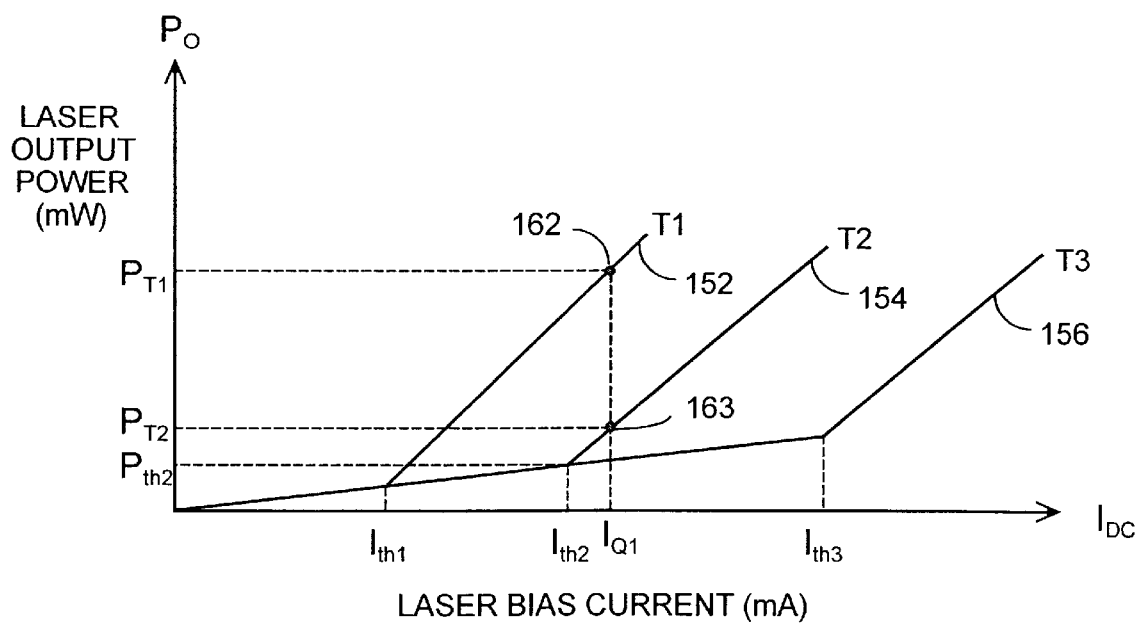
Figure 2A:
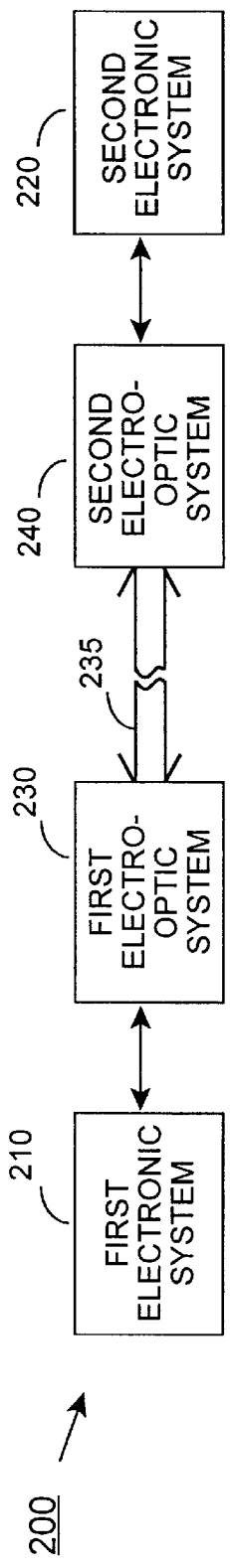
FIG. 2a illustrates an electro-optic communication system representing one embodiment in which the present invention may be utilized.

FIG. 2a illustrates an electro-optic communication system 200 representing one embodiment in which the present invention may be utilized In this embodiment, the electro-optic system 200 includes a first electronic system 210 connected to a first electro-optic system 230, and a second electronic system 220 connected to a second electro-optic system 240. An optical channel 235 provides a communication link between the first and second electro-optic systems 230, 240. In one embodiment, the optical channel 235 is a single fiber optic cable for carrying signals of various wavelengths. In another embodiment, the optical channel 235 includes two separate cables for bi-directional communication. During operation, the first electronic system 210 generates an electronic signal for transmission to the second electronic system 220. The first electro-optic system 230 receives the electronic signal, converts it to an optical signal, and transmits the optical signal over the optical channel 235 to the second electro-optic system 240. The second electro-optic system receives the optical signal, converts it back to substantially the original electronic signal, and provides it to the second electronic system 220.

The electro-optic system 230, 240 of the present invention may be implemented in other systems outside of the communications field as well. For example, in medical, research, industrial or other applications, the electro-optic system 230, 240 may be used in systems that require precision control of a laser for high levels of reliability.

Figure 2B:
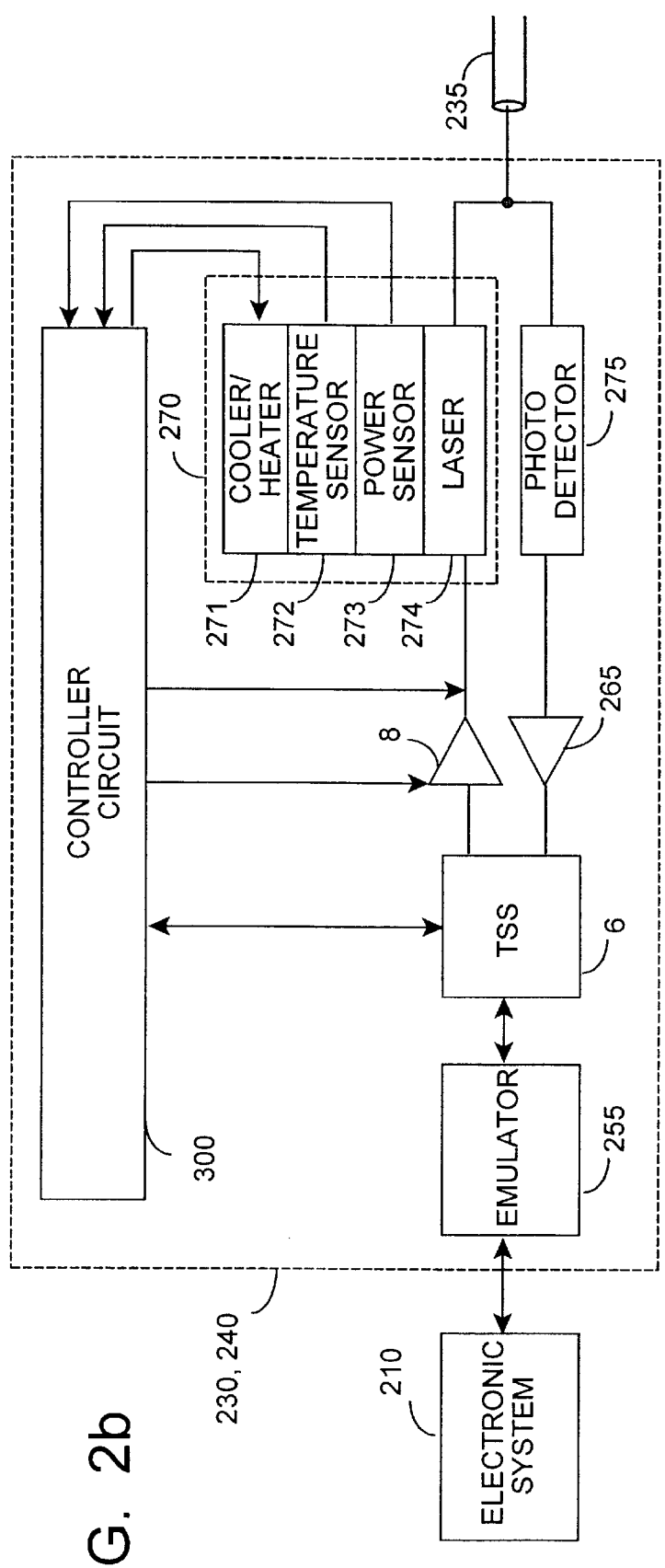
FIG. 2b illustrates one embodiment of the elector-optic system illustrated in FIG. 2a in accordance with the present invention.

FIG. 2b illustrates one embodiment of the electro-optic systems 230, 240, as illustrated in FIG. 2a, of the present invention. Each electro-optic system 230, 240 includes an emulator circuit 255 coupled to a test system switch 6. The test system switch 6 has an output coupled to a laser driver amplifier 8, and an input coupled to a photo-detector amplifier 265. The laser driver/amplifier 8 is coupled to a laser module 270 which emits an optical signal onto the optical channel 235 which is a fiber optic cable in the illustrated embodiment. In one embodiment of the present invention, the laser module 270 may include a cooling/heating element 271, an operating temperature sensor 272, a laser output power sensor 273, and a laser 274, which may be a laser diode or a light emitting diode (LED). The term "laser" may be used interchangeably for an opto-electronic device such as a Laser device or an LED. The photo-detector amplifier 265 has an input coupled to a photo-detector circuit 275 configured to receive an optical signal transmitted to the system 230, 240 along the fiber optic cable 235.

The electro-optic system 230, 240 further includes a controller circuit 300 for managing the functions of the components in the system 230, 240. In one embodiment of the present invention, the controller circuit 300 is coupled to the test system switch 6, the laser driver/amplifier 8, and to the laser module 270. The controller circuit 300 may additionally be coupled to the photo-detector 275, the photo-detector amplifier 265, the emulator 255, or other system components for controlling the operation of these components, as well.

The electro-optic system 230, 240 of a preferred embodiment may further include an input protection circuit (not shown) as disclosed in U.S. Pat. No. 6,029,423, entitled "Isolation Instrument for Electrical Testing, incorporated herein by reference. The input protection circuit protects the electro-optic system 230, 240 from over voltages, power surges and electro-static discharge.

II. Processor Circuit Architecture

Figure 3:
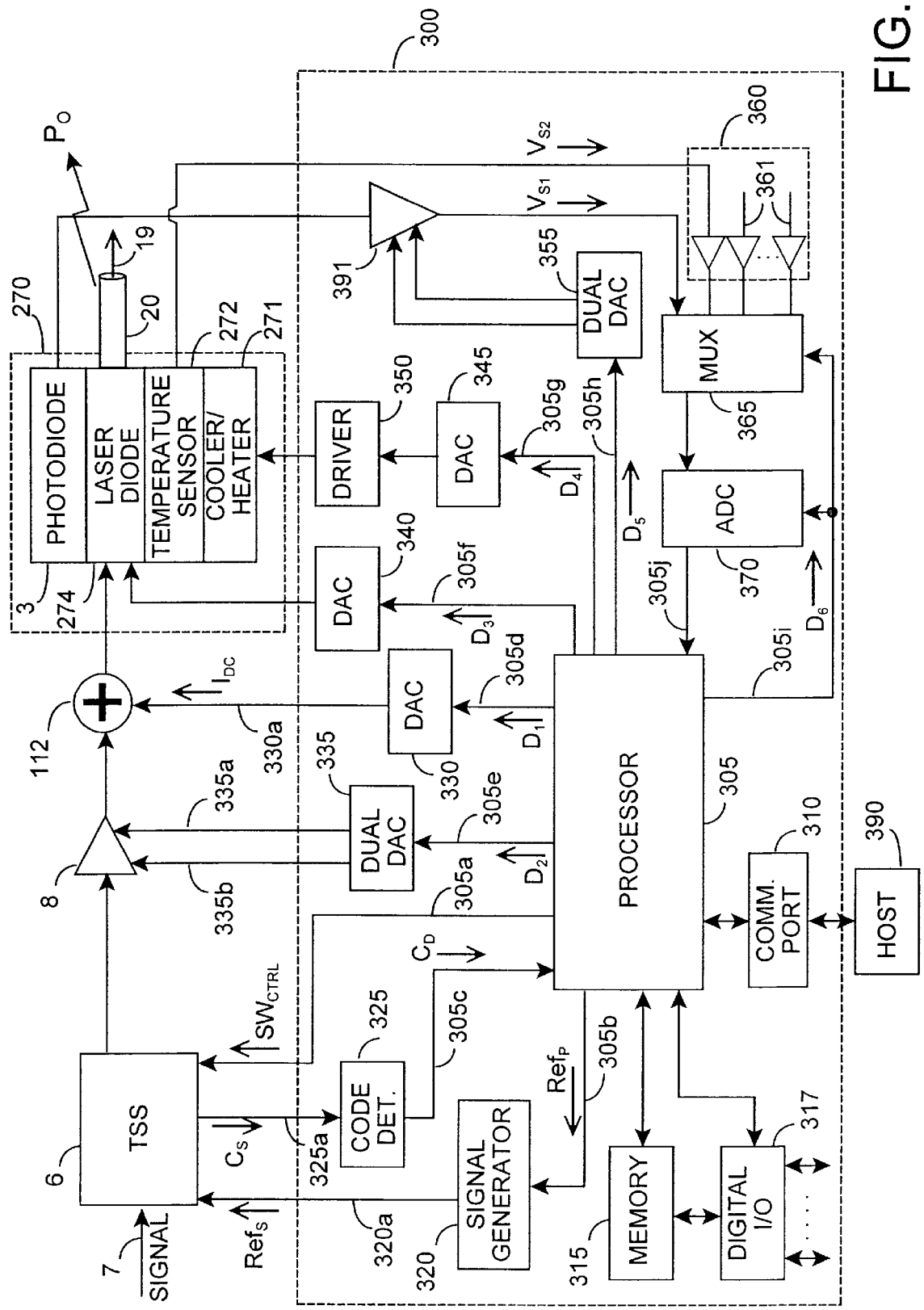
FIG. 3 illustrates one embodiment of the electro-optic system controller in accordance with the present invention.

FIG. 3 illustrates a preferred embodiment of the controller circuit 300, as shown in FIG. 2, in accordance with the present invention. As illustrated, the controller circuit 300 includes a processor 305 that is programmable using a local or remotely located host input/output (I/O) device 390. The processor 305 may include state machines, logic and a microcontroller. Depending upon the application, one or more of these logic circuits may be utilized in the processor 305, and may be part of an ASIC. The input/output device 390 communicates with the controller circuit 300 via an I/O communication port 310. In one embodiment, the processor 305 may store and/or retrieve programming signals to/from a memory storage device 315, such as an integrally formed erasable read only memory (EAROM). In an alternated embodiment, the memory storage device 315 may be a local or remotely located RAM, ROM, PROM storage device, a fixed or removable hard, floppy, or CD-ROM disc, or a similar medium which is readable and/or recordable via a corresponding drive unit (not shown). Other embodiments of the present invention may utilize other memory storage units that are operably compatible with the controller circuit 300 of the present invention. A digital input/output interface 317 may be used to generate digital control signals for transmission to other components within the electro-optic system 230, 240.

The processor 305 includes one or more switch control lines 305a coupled to the test system switch (TSS) 6 to communicate a switch control signal, $SW_{CTRL}$, for controlling the state of the switch 6. In a preferred embodiment, the switch control signals are CMOS logic level signals having voltages in the range of +/–5 VDC. The control line 305a may further include one or more power lines, typically +/–5 VDC, and a ground line to provide these signals to the switch 6.

The controller circuit 300 further includes a signal generator 320 that provides an analog waveform or a serial stream of digital data to the test system switch 6. The signal generator 320 receives a processor reference signal $Ref_p$, and, in response, produces a signal generator reference signal $Ref_s$ that is suppled to the test system switch 6 via line 320a. The reference signal $Ref_s$ is utilized to perform a transmitter calibration or a link characterization process, further described in the inventor's co-pending application Ser. No. 09/772,709, entitled "Electro-optic Interface System and Method of Operation," and incorporated herein by reference. The processor reference signal $Ref_p$ and/or the signal generator reference signal $Ref_s$ may be a DC voltage or an AC signal, in either digital or analog form. In a specific embodiment, the processor reference signal $Ref_p$ is a serial stream of bits representing a digital word, and the signal generator reference signal $Ref_s$ is an analog waveform. The signal generator 320 may include modulation, multiplexing, and/or conditioning circuitry, such as amplifiers, filters, and the like. In an alternate embodiment, the signal generator 320 produces a digital-to-analog reference signal $Ref_s$ that is applied to the preamplifier 8 via the TSS 6 to calibrate the laser transmitter system.

The processor 305 may further include a signal receiver (not shown) coupled to the test system switch 6 and configured to receive a returned reference signal which is communicated from the second electro-optic system 240, as shown in FIG. 2*a*, during the link characterization process, further described in the above referenced "Electro-optic Interface System and Method of Operation" application. The receiver may be configured to receive and process analog and/or digital signals and may include modulation, multiplexing, and/or conditioning circuitry, such as amplifiers, filters, digital-to-analog converters, analog-to-digital converters and the like. In one embodiment of the present invention, the waveforms generated by the signal generator 320 may be used to determine signal to noise ratios and bit error rates of the fiber optic communications channel shown in FIG. 2*a*, and as described in the link characterization process of the "Electro-optic Interface System and Method of Operation" application.

The processor 305 and test system switch 6 are further coupled together by means of a code detector 325 operable to identify the reception of an encoded signal received by the electro-optic system 230 or 240, as shown in FIGS. 2*a* and 2*b*. The code detector 325 is coupled to the test system switch 6 via a line 325*a* to receive a coded signal $C_s$. In a preferred embodiment, the coded signal $C_s$ is a binary word of a predefined length to indicate that a link characterization process is underway. A link characterization process of a preferred embodiment determines the existence and quality of the communication link, and is further described the above referenced "Electro-optic Interface System and Method of Operation" application.

In response to the coded signal $C_s$, the code detector 325 outputs coded data $C_D$ to the processor 305 via lines 305*c*. The coded signal $C_s$ and coded data $C_D$ may be DC voltages and/or an AC signals, in either analog or digital form. In a preferred embodiment, the code detector 325 is a digital comparator having two registers. A first register is loaded with a predetermined pattern of binary bits containing a code. A second register is a universal asynchronous receiver transmitter (UART) register in which the incoming bits are received and shifted. The digital comparator includes a second stage in which each bit in the first and second registers are compared. If all of the bits in the first and second registers match, the code signal $C_s$ is deemed received, and the coded data $C_D$, a high logic level in one embodiment, is output to the processor 305. Some or all of the described functions may reside within the processor 305 as hardware, software, and/or firmware.

In other embodiments of the present invention, each signal line 305*a*, 320*a* and 325*a* may comprise an integrated bus line in addition to the aforementioned control and data signals, $Ref_S$, $C_S$, and $SW_{CTRL}$, respectively. The integrated bus lines may include power and ground potentials, as well as other digital and/or analog signals.

In a preferred embodiment, the controller circuit 300 includes a current source or digital-to-analog converter (DAC) 330 coupled to the processor 305 via line 305*d*. In an alternate embodiment, a pulse width modulator (PWM) with a filter may be utilized in place of the DAC 330. The DAC 330 provides current to drive the laser 274. In response to a suppled digital signal $D_1$ from the processor 305, the DAC 330 generates a laser biasing current $I_{dc}$. During operation, the processor 305 outputs a digital signal $D_1$ having a multitude of different values, depending upon the desired level of laser output power, $P_O$. The processor of the present invention also generates a multitude of different digital signals $D_1$ to calibrate the laser 274, the process of which is further described below.

The controller circuit 300 also includes a dual digital-to-analog converter 335 for controlling the output signal level and/or the gain of a laser driver/amplifier 8. The dual DAC 335 is coupled to the processor 305 via line 305*e*, and receives digital control signals $D_2$ for each one of the DACs in dual DAC 335 to set the output power level and the signal gain of the laser driver/amplifier 8 via lines 335*a* and 335*b*. The value of the digital control signal $D_2$ may be determined responsive to operating parameters such as output signal level of the test system switch 6, input handling of the laser 274, and/or a sensed laser output power. Other operating parameters of the laser module 270, such as the sensing of the laser wavelength that may be utilized for other embodiments of the laser control system, may also be used for determining the value of $D_2$.

In an embodiment in which the laser 274 is tunable, the controller circuit 300 may further include a DAC 340 for controlling the wavelength of the laser 274. The DAC 340 is coupled to the processor 305 via line 305*f*, and receives a digital control signal $D_3$ corresponding to the desired wavelength of the laser 274. The DAC 340 generates an analog signal that is supplied to a wavelength tuning input of the laser 274. The emitted wavelength of the laser 274 may vary in response to a variety of signal characteristics, for example, the amplitude, phase, or frequency of the signal output from the DAC 340. In other embodiments or the present invention, the signal output from the DAC 340 may be used in conjunction with other electro-optic devices to tune the laser. Those skilled in the art will appreciate that circuits other than a DAC circuit may be used to tune the wavelength of the Laser 274.

The controller circuit 300 may further include a DAC 345 and driver 350 configured to control the operation of a heating and/or cooling element 271, which may be integrally formed with the laser 274 in the laser module 270. The DAC 345 has an input 305*g* which is coupled to the processor 305, and receives a digital control signal $D_4$ corresponding to the desired laser temperature setting. The value of the digital control signal $D_4$ may be determined responsive to operating parameters such as a sensed operating temperature that indicates that the laser is operating outside of a predefined temperature window. Alternatively, or in addition, a sensed operating temperature may indicate that the laser has undergone a relative change in operating temperature beyond a predefined window. Other operating conditions of the laser module 270 of alternate embodiments may also be included in determining the value of $D_4$.

In a preferred embodiment of the present invention, the controller circuit 300 may include a dual DAC 355 that is utilized to modify the gain and offset of an amplifier 391. The amplifier 391 is connected to a photodiode circuit 3 that outputs photodiode characteristics in response to the light detected from the laser. A calibrated voltage $V_{S1}$ is provided at the output of the amplifier 391.

The controller circuit 300 further includes sensing amplifiers 360, a multiplexer 365, and an analog to digital converter (ADC) 370 coupled to the processor 305. In other embodiments, the analog to digital converter 370 may be a companding (logarithmic) analog to digital converter which may offer the advantage of having a higher degree of resolution for low level signals. The sensing amplifiers 360 are used to amplify a variety of operating signals such as a laser temperature voltage $V_{s2}$ from a temperature sensor 272 which indicates the operating temperature of the laser 274. In one embodiment of the present invention, one or both of the voltages $V_{s1}$ and/or $V_{s2}$ may be provided as outputs of the laser module 270. Other sensing amplifiers 361 may be used to sense additional operating parameters such as the laser current and voltage to determine power.

The outputs of the sensing amplifiers 360 are coupled to the multiplexer 365. The multiplexer selects an output of one of the sensing amplifiers in response to a digital control signal $D_6$ from the processor 305 transmitted along control line $305_i$. The output of the multiplexer 365 is coupled to an ADC 370 which converts the selected signal, such as analog voltage $V_{s1}$, or $V_{s2}$, to a digital signal. The digital signal is supplied to the processor 305 via line 305j. In this manner, the processor 305 can monitor operating parameters of the electro-optic system 230, 240, including the output power $P_O$ and operating temperature of the laser 274. Those of skill in the art will appreciate that the same or similar arrangement may be used to monitor other operating parameters of the laser 274, laser module 270, laser driver/amplifier 8, test system switch 6, or other components of the electro-optic system 230, 240. Responsive to the monitored operating parameters, e.g., the output power $P_O$ and/or operating temperature of the laser 274, the processor 305 may adjust any of the values of the digital signals, including signal $D_1$ for controlling the laser biasing current $I_{DC}$, signal $D_2$ for controlling the dual D/A 335, or signal D3 for controlling the light emitted by the laser 274.

In one embodiment of the present invention in which analog signals modulate the input to the laser 274, the processor 305 senses the operating temperature of the laser 274 by means of the sensing amplifiers 361. As is further described below, the laser 274 undergoes a calibration routine to determine the laser transfer function and optimum bias condition for laser operation at one or more laser operating temperatures. The processor 305 retrieves parameters from memory 315 to determine the optimum laser operating currents, and outputs a corresponding digital signal $D_1$ to the pulse width modulator (PWM) or DAC 330 and a corresponding digital signal $D_2$ to the DAC 335. In an alternate embodiment, in which digital signals modulate the laser frequency utilizing DAC 340, the processor 305 senses the operating conditions and performs a similar compensation as described above by adjusting the controller circuit DACs.

The controller circuit 300 has been described in terms of the components and interconnections for controlling a single electro-optic system 230. Alternatively, in a larger electro-optic system such as a wavelength division multiplexing (WDM) system which includes multiple channels, each channel having the aforementioned components as shown in FIG. 2B, the controller circuit 300 may operate to control the operations of some or all of the components within each channel. The architecture of an exemplary WDM electro-optic system 230 is further described in applicant's co-pending patent application "Electro-Optic Interface System and Method of Operation."

III. Controller Circuit Operation

Figure 4:
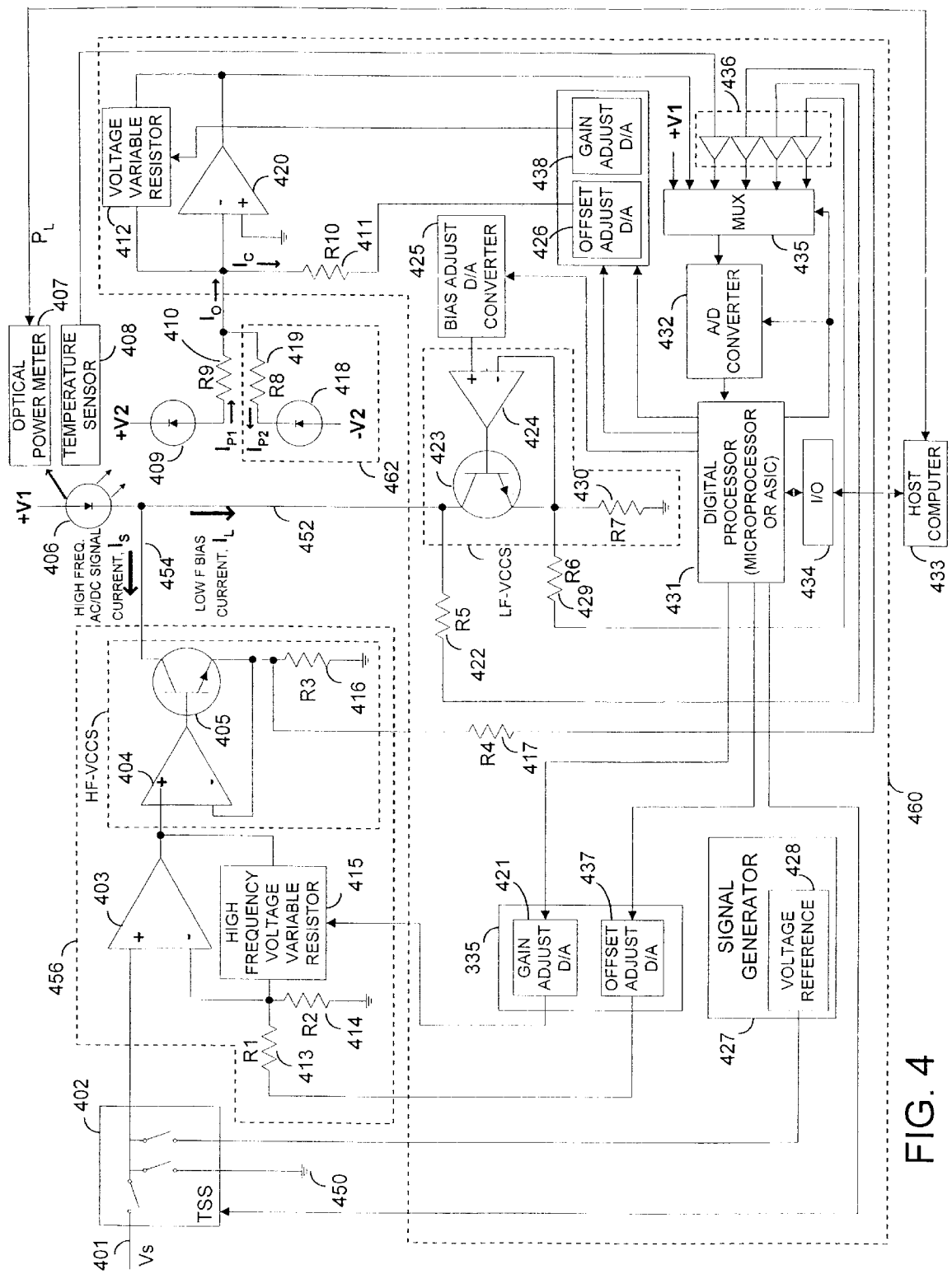
FIG. 4 illustrates a second embodiment of the electro-optic system controller utilized for calibration methods in accordance with the present invention.
Figure 9:
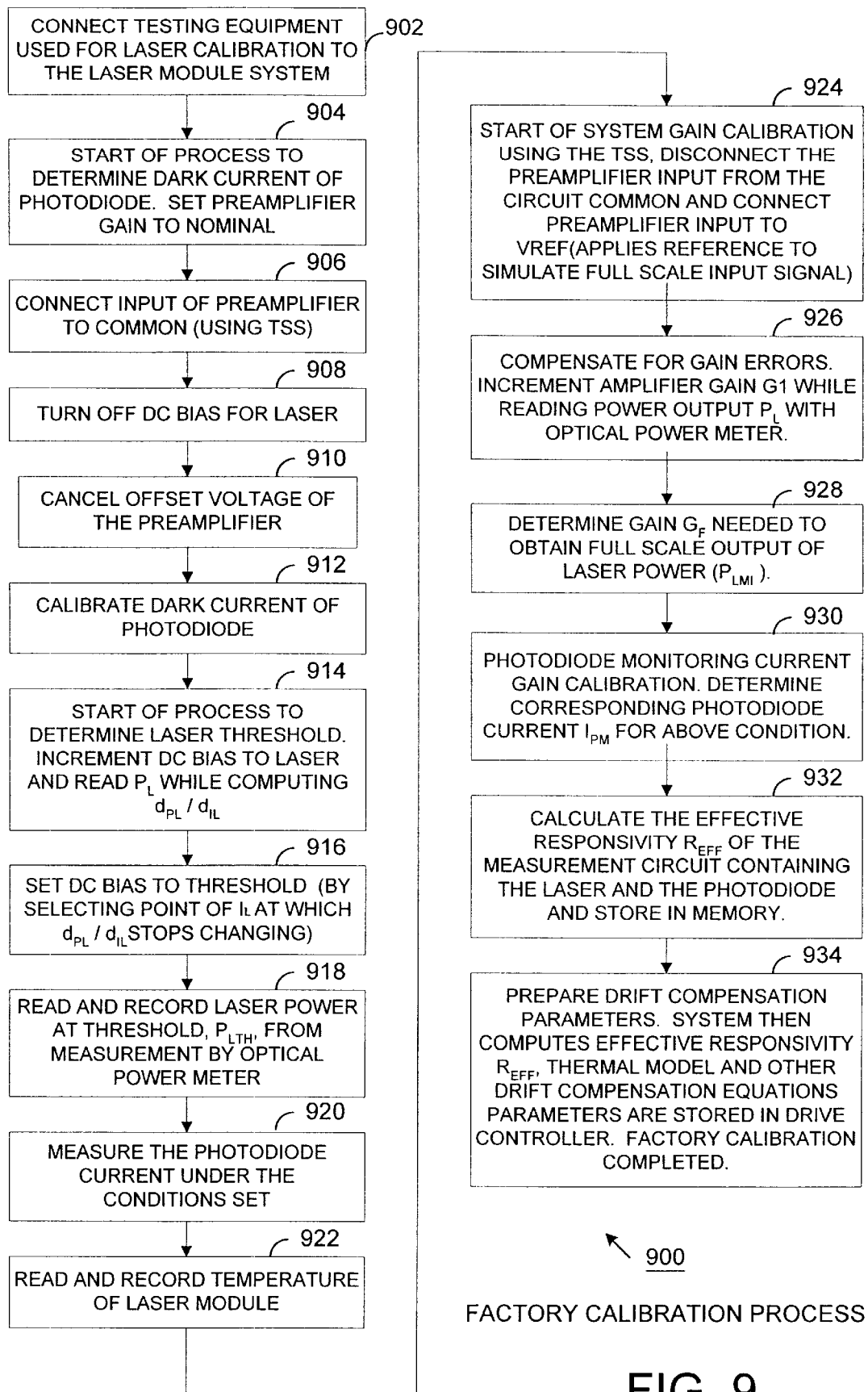
FIG. 9 illustrates one embodiment of the drive controller factory calibration process in accordance with the present invention.
Figure 10:
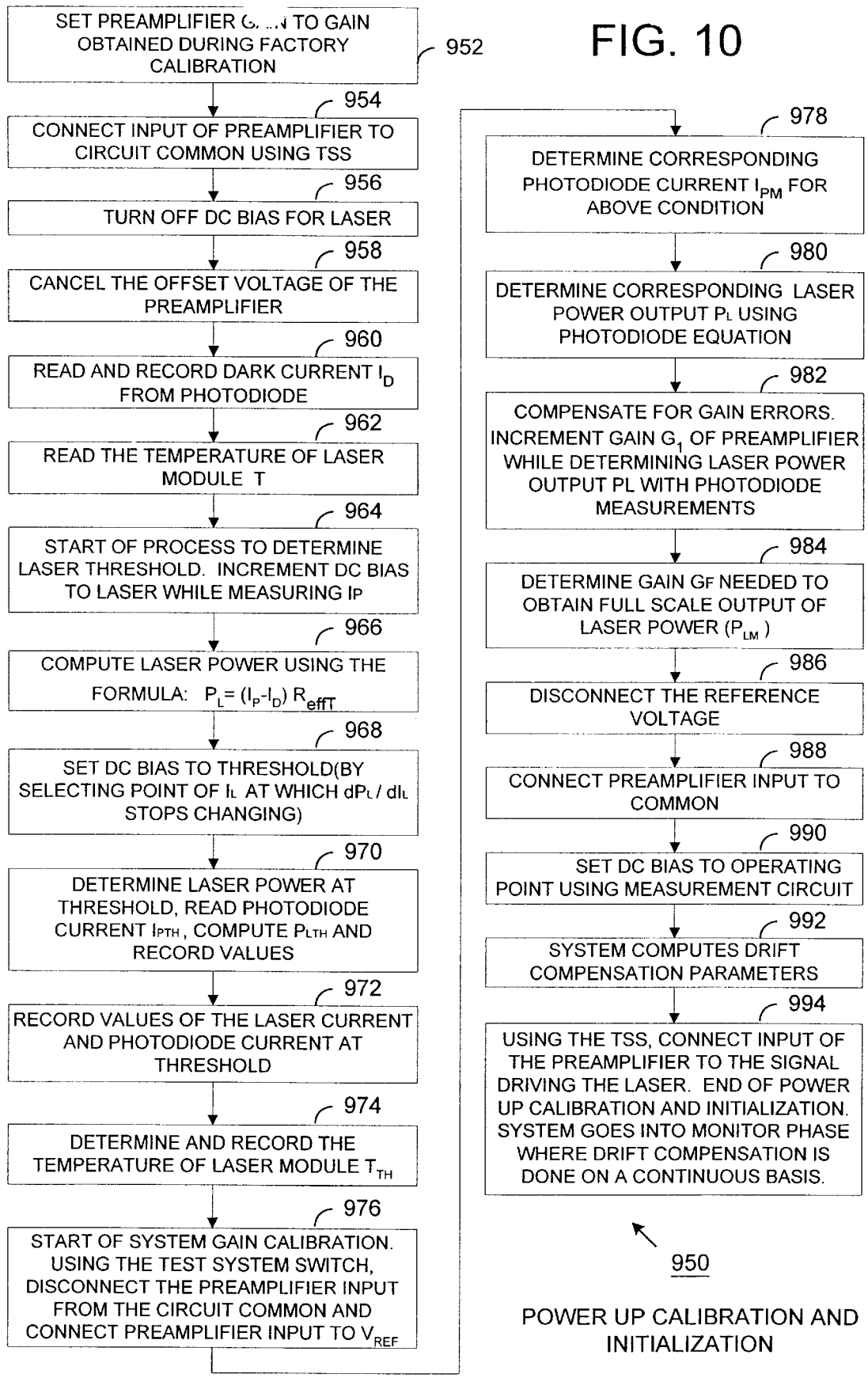
FIG. 10 illustrates one embodiment of the power up calibration and initialization process in accordance with one embodiment of the present invention.

An electro-optic system 230, 240 of the present invention includes a controller circuit 300, as shown in FIG. 3, for controlling and calibrating the electro-optic system 230, 240. The controller circuit 300 drives the laser 274, monitors the operation of the laser 274 utilizing measurement circuits, maintains operating parameters of the laser 274 for ensuring operation within acceptable limits over temperature and device variations, and controls operation of related circuits such as signal amplifiers 8, 391 and host computer 390 interfaces. A model showing a preferred embodiment of the electro-optic system 230, 240 used to perform a factory calibration process 900 and a power up calibration process 950 is shown in FIG. 4. FIG. 9 is a flowchart summarizing a preferred embodiment of a method for a factory calibration process 900 in accordance with the present invention. FIG. 10 is a flowchart summarizing a preferred embodiment of a power up calibration and initialization process 950 in accordance with the present invention.

a. A Factory Calibration Process

Referring to FIG. 9 and FIG. 4, a factory calibration process 900 is performed by connecting testing equipment used for laser calibration to the laser drive control system 460, as shown in step 902. In a preferred embodiment, the testing equipment may consist of an external optical power meter instrument 407 having an I/O interface to a host computer 433, as shown in FIG. 4. The Host Computer 433 of a preferred embodiment is a personal computer (PC) that connects to the laser drive control system utilizing any suitable input/output (I/O) interface such as a universal serial bus (USB) interface. An optical power meter 407 is connected to the output of the laser 406 in a manner that represents the physical configuration of the target system, i.e. the system that utilizes the calibrated laser. For example, a target system may be a laser system utilized in medical applications or a laser system for fiber optic communications.

Once the testing equipment is connected to the laser module system 902, the dark current of a photodiode 409 is determined in steps 904 through 912, by first setting the preamplifier 403 gain to nominal, step 904. The signal preamplifier 403 normally has a given amount of offset voltage. This offset voltage translates into an offset current being applied by the High Frequency Voltage Controlled Current Source (HF-VCCS) to the laser diode 406. The methods described herein corrects for the offset current caused by the signal path 454. This offset current will cause an error for applications where the electro-optic system 230, 240 is required to drive the laser 406 with a DC signal in addition to an AC signal. The gain of the laser driver amplifier 456 is set to a predetermined nominal amount in order to amplify the offset by the amount expected during normal operation. After this adjustment is made, any drift of the offset voltage with temperature or with a small change of amplifier gain is accounted for by setting an appropriate margin in the amount of DC bias current $I_L$ to the laser 406, as discussed further below for step 990 in the power up calibration sequence 950 as shown in FIG. 10.

The appropriate selection of resistor values R1 and R2 for the preamplifier 403 allows an offset adjustment 437 to be highly independent of a gain adjustment 421. A preferred way to achieve independent adjustments for offset and gain for the laser driver amplifier 456, and to retain a high input impedance for the signal input 401, is to apply an offset current to the minus input of the preamplifier 403 with a relatively large value of resistor R1 (413) as compared to the resistance value of the high frequency voltage variable resistor 415. In an alternate embodiment, independent offset and gain adjustments may be accomplished utilizing an offset adjust D/A converter 437 that contains a high impedance current source output. Another option to adjust offset is the use of a separate amplifier (not shown) inserted between amplifiers 403 and 404.

In step 906, zero volts is connected to the input of the laser driver amplifier 456 by connecting the Test System Switch (TSS) 402 to circuit common 450. Zero volts is connected to the high frequency amplifier 456 to ensure that a high frequency DC/AC signal current $I_S$ is not applied to the laser 406 via the signal path 454. The calibration process continues by turning off the DC bias for the laser, step 908, by supplying an appropriate digital word to the digital to analog converter 425. The analog signal produced by the digital to analog converter 425 turns off the low frequency bias current $I_L$ normally generated by the Low Frequency Voltage Controlled Current Source (VCCS) comprised of amplifier 424, transistor 423 and resistor 430. With the high frequency signal drive $I_S$ and the low frequency bias drive $I_L$ set to an off condition, no light is emitted from the laser 406, and the dark current in the photodiode 409 may be measured.

In step 910, the offset voltage of the laser driver amplifier 456 is canceled by changing the offset adjust digital to analog converter 437 while monitoring the offset by a measurement of the voltage across resistor R3 (416). To null the offset voltage of the laser driver amplifier 456, the laser drive control system 460 adds an offset current to the minus input of amplifier 403. Utilizing the offset adjust D/A converter 437, the laser drive control system 460 sets an appropriate voltage value to resistor R1 (413), which then applies the appropriate value of current to the minus input of the preamplifier 403. The offset D/A converter 437 is incremented or decremented until the offset of the high frequency signal path 454 is zero. The high frequency signal path 454 is driven by amplifier 403 and the High Frequency VCCS 404, 405, 416. The offset measurement is carried out by first sensing the voltage across R3 (416) with an offset sensing resistor R4 (417) that is coupled to the processor 431 via a measurement path of a sensing amplifier package 436 connected to a multiplexer 435 that is connected to an analog to digital converter 432. One amplifier in the sense amplifier IC 436 amplifies the sensed voltage, and the processor 431 sends the appropriate control signal to the multiplexer 435 to select the input of the sensed voltage across the offset sensing resistor R4. The resistor R4 and the sense amplifier IC 436 provide high impedance isolation for the laser driver amplifier circuit 456. The digital processor 431 then determines if the word received corresponds to a zero current.

Figure 5:
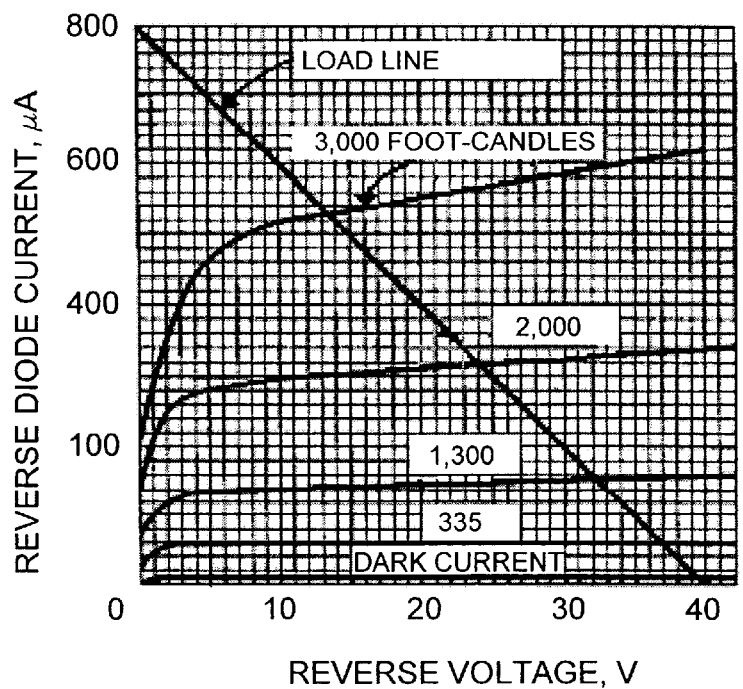
FIG. 5 illustrates the volt-ampere characteristics for an exemplary germanium photodiode in accordance with the present invention.

The dark current of photodiode 409 is calibrated, as shown in step 912, in order to avoid errors as the photodiode 409 changes with temperature and aging. If the laser 406 has no current drive, then the output light power of the laser 406 is zero, that is, no light is coupled into monitoring photodiode 409. The parasitic dark current $I_D$ is defined as the current that flows through the photodiode 409 for a no-light output condition. The measured dark current $I_D$ is utilized to compensate the system measurements. FIG. 5 shows the volt-ampere characteristics for a germanium photodiode. These characteristics are clearly nonlinear for reverse voltages below 10 volts. A typical photodiode current $I_O$ is given by $$I_O = I_R + I_D(1 - e^{V/nV_T}) \quad \text{equation 1}$$

where $I_O$, $I_R$, and $I_D$ represent the magnitude of the reverse current, V is negative for a reverse bias, and n varies based upon the material used in the process. $V_T$ is a voltage equivalent of temperature, where $V_T = T/11,600$, and T is in degrees Kelvin. $I_D$ is the reverse saturation current which is also known as dark current. The photodiode current, as shown in equation 1, is highly dependent on temperature. Additional leakage of current over the surface of the photodiode contributes to this current beyond that shown in equation 1. Additional experimental data places the temperature drift of the reverse saturation current $I_D$ at 7% per degree C. In addition, the volt-ampere characteristics will drift somewhat with photodiode age. Finally, $I_R$ is the current proportional to the light intensity obtained with low values of a series resistance. The series resistance R9 (410), as shown in FIG. 4, is represented by the load line of FIG. 5.

There are many other types of photodiodes and photo detectors. For example, some systems utilize avalanche photodiodes. These other devices, which exhibit similar issues in terms of temperature drift and aging, also can be described by equations. Thus, other embodiments of the present invention may be calibrated in a similar manner to what is shown in the preferred embodiment utilizing an appropriate model.

An example of the significance of the dark current error is illustrated utilizing the characteristics of the monitor photodiode used with the Mitsubishi MLXX2 series laser diode. This device has a dark current $I_D$ of 0.5 μA at 25° C. At 55° C., the dark current will have been increased by 7% factor for each additional change of temperature in degree C., i.e. a change of temperature of 30° C., resulting in a dark current $I_D = (0.5 \mu A)(1.07)^{30} = 3.806 \mu A$. For this example, a laser output of 3 mW may have a photodiode current that is 150 μA. Thus, the change in the dark current from 25° C. to 55° C. is approximately 2.5% of the photodiode output current. Generally, errors of no more than a fraction of a percent are desired in order to allocate error budget for the other areas of the electro-optic system. The foregoing discussion demonstrates the need to account for dark current. A laser drive controller 460 that utilizes a photodiode 409 to monitor and control a laser must account for the dark current in order to avoid significant errors due to temperature drift and aging of the photodiode.

A preferred embodiment of the present invention for measuring and subtracting the dark current from the laser drive controller 460 is shown in FIG. 4. This embodiment includes of a current amplifier consisting of an operational amplifier 420 and a voltage variable resistor 412. Matching photodiodes 409 and 418 are connected to the summing junction of the operational amplifier 420 through series resistors R9 (410) and R8 (419), respectively. Typically, matching photodiodes are photodiodes from the same manufacturing process, i.e. that are made at the same time. The operational amplifier 420 is a precision amplifier with low bias currents and a current-to-voltage conversion gain determined by the magnitude of the voltage variable resistor 412. The photodiodes 409, 418 are mounted on a circuit card of the laser drive controller 460 in such way that the temperatures of each photodiode match and track with changes. For example, the photodiodes 409, 418 may be positioned against each other as part of the same module or in the same integrated circuit to ensure a close match of temperatures. Each photodiode 409, 418 is reverse biased by the application of a voltage +V1 or −V2 as needed. In a preferred embodiment, the top photodiode 409 receives a portion of the laser output light, whereas the bottom photodiode 418 receives no light. Thus, the total current into the summing junction of the amplifier 420 is given by:

$$I_O = I_{p1} - I_{p2} = I_R + I_D(1 - e^{V/nV_T}) - I_D(1 - e^{V/nV_T}) = I_R \quad \text{equation 2}$$

In this manner, one of the branches to the summing junction subtracts the dark current, $I_D$. The only current remaining is the current $I_R$ resulting from the light intensity being coupled from the laser diode 406 to the photodiode 409.

Another common problem in photo detection is that the photodiode devices may exhibit non-linearities in portions of their characteristics. An important feature of the circuit of the preferred embodiment is the presence of a current amplifier 420 that allows the use of low values, e.g. tens of ohms, for resistors R8 and R9. The low value of resistance causes a load line, as shown in FIG. 5, to have a steep slope, which allows photodiode operation in the area where the current $I_R$ changes linearly with the light intensity. This is crucial in a preferred method of calibration since the matching photodiode circuit simplifies the calibration of the photodiode 409, and allows the use of only two data points to determine the line representing the photodiode characteristic.

In second embodiment of the present invention, it is also possible to utilize only one photodetector 409 and simply subtract the dark current $I_D$. The remaining discussion of the methods for calibration assumes that the second photodetector 462, as shown by the by dotted line in FIG. 4, is not present. The second embodiment for subtracting the dark current $I_D$ utilizes a compensating current $I_C$ applied to the summing junction of the operational amplifier 420. The compensating current Ic is generated by changing the value of a digital word sent to the offset adjust D/A converter 426 by the processor 431. The D/A converter 426 provides the compensating current $I_C$ through resistor R10 (411). By this process, the dark current $I_D$ is treated as an additional offset to the offset adjustment required by the amplifier 420.

A third embodiment for subtracting dark current $I_D$ error may be accomplished by measuring the magnitude of the dark current $I_D$, and subtracting the measured dark current value from all subsequent photodiode measurements. This approach may be used in factory calibration processes for low cost systems where there is a need to eliminate the offset adjustment circuits. For the remainder of the calibration discussions, it is assumed that the approach used simply subtracts dark current and no offset adjusting circuit is used.

Figures 6A, 6B:
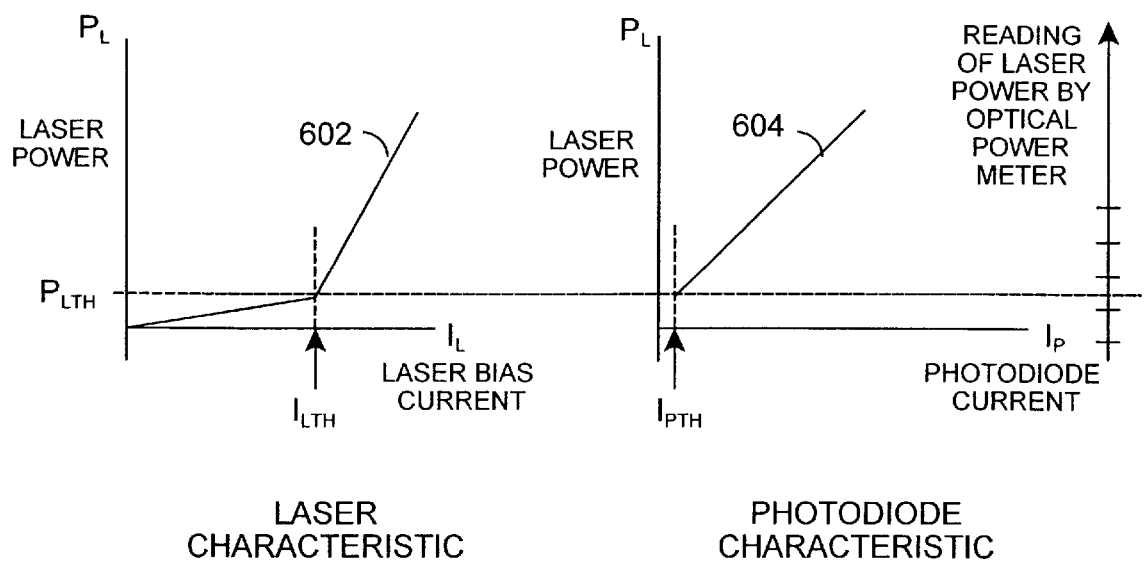
FIGS. 6a and 6b illustrate the laser and photodiode characteristics, respectively, measured during the calibration process in accordance with one embodiment of the present invention.

The threshold currents of the laser 406 and corresponding photodiode currents 409 are determined in steps 914 through 922 as shown in FIG. 9. These steps are preformed to calibrate the photodiode current at the laser threshold, and to set the laser current to the threshold during calibration. FIG. 6 illustrates the various parameters utilized for calibration of the photodiode. Specifically, FIG. 6a illustrates a laser gain characteristic 602 and a photodiode gain characteristic 604. The Optical Power Meter 407 is utilized to obtain the laser power $P_L$. In step 914, the DC bias current to the laser 406 is incremented gradually by changing the input of the bias adjust digital to analog converter 425 utilizing the digital processor 431. The change to the input of the digital to analog converter 425 applies a voltage to a precision low frequency Voltage Controlled Current Source (VCCS) that changes the current output of the low frequency VCCS on the DC bias path 452. The low frequency VCCS consists of an amplifier 424, a transistor 423, and a resistor R7 (430). The low frequency VCCS of the present invention has the capability to increment the bias current $I_L$ of the laser diode 406. Gradually incrementing the laser bias current to avoid an overcurrent switching of the laser is recommended by manufacturers to avoid damaging the laser due to the drastic changes that may occur in the laser characteristic with a change in temperature. Additionally, the level of power output $P_L$ is not known prior to power up of any given laser 406. Each time the laser bias current $I_L$ is incremented, the laser power $P_L$ is read by the host computer 433 with external optical power meter 407 as shown in FIG. 4.

In step 916, the DC bias current $I_L$ is set to a threshold $I_{LTH}$ by setting the bias current $I_L$ to a value at which the derivative $dP_L/dI_L$ stops changing. This method is guarantees that the threshold $I_{LTH}$ will be set in the linear region of the laser characteristic. In other words, by computing $dP_L/dI_L$, the derivative of laser power with respect to laser current, it is possible to know whether the laser has fully transitioned from a region of spontaneous emission, to a region of stimulated emission. The transition is known to have occurred when the derivative $dP_L/dI_L$ reaches a maximum constant value and the laser current $I_L$ has gone past the threshold $I_{LTH}$. Thus, during the calibration process of the preferred embodiment, the laser current $I_L$ is incremented beyond the threshold current $I_{LTH}$, and then gradually decreased until a change in the derivative is detected again. Depending on the specific laser drive control system 460 used in the electro-optic system 230, 240, there may be a need to implement a low pass filter on the data returned from the measurement circuits if there is noise present, or if there are minor remaining non-linearities in the gain characteristic of the laser 406. Once the threshold current $I_{LTH}$ is determined, the laser drive control system 460 records the laser threshold current value $I_{LTH}$. Any further changes in the threshold current $I_{LTH}$ due to conditions such as a change in temperature may be treated as a system offset by the processor 431.

The foregoing method of determining the laser current threshold $I_{LTH}$ is different from approaches employed by laser manufacturers. Typically, manufacturers define the current threshold as the intersection of a tangent line in the region below the transition region of a laser characteristic to a tangent line in the region above transition region. This approach will derive a value of the threshold current $I_{LTH}$ centered in the transition region, i.e. the nonlinear region of the laser characteristic. The method of the present invention utilizes a point at which $dP_L/dI_L$ reaches a stable value to determine a laser current threshold $I_{LTH}$. This method guarantees that a laser 406 will operate in the linear region of the laser characteristic for a measured threshold current $I_{LTH}$.

Continuing with FIG. 9, once the threshold $I_{LTH}$ is determined, the laser power at threshold $P_{LTH}$ is read and recorded, as shown in step 918, utilizing the optical power meter 407. In step 920, the photodiode current $I_{P1}$ is measured and recorded under the threshold conditions set in step 916. The recorded value of the photodiode threshold current $I_{P1T}$ is corrected by the microprocessor 431 by subtracting the value of the dark current $I_D$, as determined in step 912, from the photodiode current measurement in order to obtain a calibrated value for the photodiode current $I_{PTH}$ at the laser threshold $I_{LTH}$. In this embodiment of the present invention, the laser drive control system 460 does not use the dark current compensation circuits 462, as shown in FIG. 4. Specifically, the threshold value of the photodiode current $I_{P1T}$ is measured and recorded via the path through amplifier 420 to the MUX 435 and A/D converter 432, and to the digital processor 431. A precision method for measuring the laser bias current $I_L$ starts with the sensing of a voltage across resistor R7 (430) by a sensing resistor R6 (429). The voltage is routed through an amplifier of the sense amplifier package 436 to the multiplexer 435, and is converted to a digital word by A/D converter 432. The processor 431 examines the digital word from the A/D converter 432.

In step 922, the temperature of the laser temperature sensor 408 is read and recorded at the threshold calibration. The temperature at threshold calibration $T_{STC}$ is utilized by the processor 431 to associate a given temperature with the threshold laser current $I_{LTH}$, the threshold photodiode current $I_{PTH}$, and the photodiode dark current $I_D$. The voltage of the temperature sensor 408 is amplified by one of the sensing amplifiers 436, routed by the multiplexer 435, converted into a digital word by the A/D converter 432, and then recorded in memory by processor 431. By a similar process, the processor 431 determines the power consumption in the laser 406 by measuring the DC bias current $I_L$ with sense resistor R6 (429), and by determining a voltage across the laser diode by measuring the voltage +V1 and the voltage at the collector of transistor 423 with the use of sense resistor R5 (422). Utilizing the thermal model as described below in the section entitled "Drift Compensation Methods and Laser Thermal Model", the temperature of the laser 406 is determined and recorded by the Processor 431.

Figures 7A, 7B:
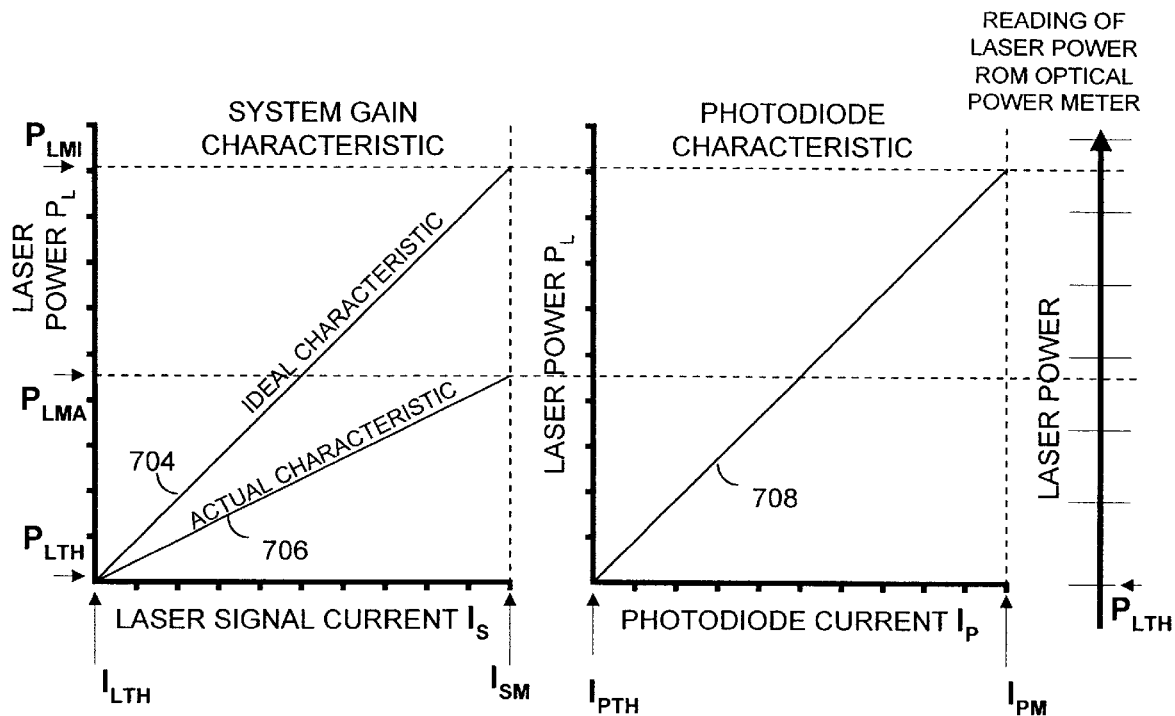
FIGS. 7a and 7b illustrate the laser and photodiode characteristics, respectively, in accordance with the present invention.

Continuing with FIG. 9, the system gain calibration is determined in steps 924 through 928. Using the test system switch 402, the input to preamplifier 403 is disconnected from the circuit common 450 and connected to the voltage reference 428 of the signal generator 427. A precision full-scale reference voltage $V_{REF}$ is applied to the input of the signal preamplifier 403. FIGS. 7a and 7b are graphical representations of a model utilized for this step. FIG. 7a illustrates an ideal system gain characteristic 704 and an actual system gain characteristic 706 for a laser signal current $I_S$. The actual characteristic 706 has a different slope than the gain represented by the ideal characteristic 704. Differences in the ideal and the actual gain characteristics 704, 706 result from errors in the gain of the preamplifier 403 as well as errors in the slope efficiency of the laser 406. The high frequency AC/DC signal path, which includes the laser, has an overall gain $G_S$ that is defined as the output optical power $P_L$ per unit of input signal current $I_S$ to the laser 406. The input signal current $I_S$ is related to the input voltage signal 401 that is used to modulate the laser 406. Further, the signal system gain $G_S$ is a multiplier to the input signal $I_S$, and is not related to the DC bias of the laser 406. One way to determine the system signal gain $G_S$ is to determine the response generated by an input signal $I_s$. By the principle of superposition, any additional current driving the laser 406 is simply added to the value of $I_{LTH}$, and may be analyzed independently from the bias current $I_L$ of the DC path. Thus, the DC bias $I_L$ is shown as an offset that translates the origin of the coordinate system of FIG. 7a to the threshold point $I_{LTH}$, and any additional current to the laser 406 is driven from the high frequency signal path 454. As shown FIG. 7a, for gain calculation purposes, the origin of the laser characteristic 706 is placed at the point ($I_{LTH}$, $P_{LTH}$). Similarly, the origin of the photodiode characteristic 708 is placed at the point ($I_{PTH}$, $P_{LTH}$).

In step 926, the gain G of the high frequency AC/DC signal path for the electro-optic system is compensated to account for the deviation in the ideal and actual gain characteristics as described above and as shown in FIG. 7a. While applying a nominal full-scale voltage $V_{REF}$ to the laser driver amplifier 456 via the test system switch 402, a voltage of $V_{REF}$ $G_{1A}$ is produced at the output of the preamplifier 403, where $G_{1A}$ is the gain of the preamplifier 403. This produces a maximum laser current $I_{SM}$ of $$I_{SM}=V_{REF}G_{1A}/R_{1A} \qquad \text{equation 3}$$

and a laser optical power output of:

$$P_{LMA}=V_{REF}G_{1A}G_{LA}/R_{1A} \qquad \text{equation 4}$$

where $G_{LA}$ is the gain of the laser transfer characteristic (i.e. the slope efficiency).

The system gain transfer characteristic exhibits an actual gain $G_{1A}G_{LA}/R_{1A}$, that is different from the nominal or ideal gain. At this point in the process, the value of the maximum laser current $I_{SM}$ and the value of the laser optical power output $P_{LMA}$ are read and recorded. The Optical Power Meter 407 is utilized to measure the laser optical power output $P_{LMA}$ in this process. For a given laser current $I_{SM}$, different readings of power are obtained depending upon the slope of the laser characteristic 706 and the actual gain of the laser driver amplifier 456.

Figure 8:
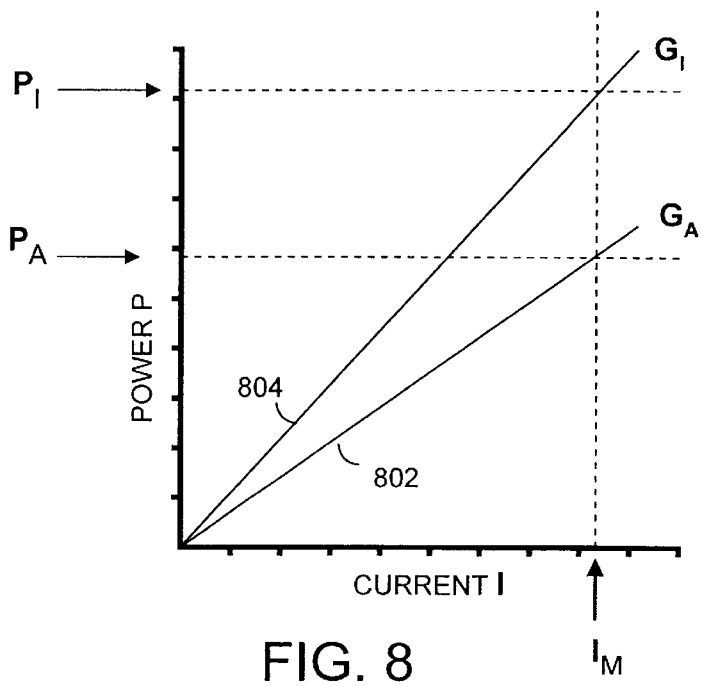
FIG. 8 illustrates the laser transfer characteristic in accordance with one embodiment of the present invention.

FIG. 8 illustrates a general approach to calibrating gain errors. In this example, the values obtained for power are:

$$P_I=I_M G_I, \text{ and } P_A=I_M G_A. \qquad \text{equation 5}$$

where the subscript A represents actual measurements and the subscript I represents the ideal values we should obtain. Solving for $P_I$ $$P_I=P_A G_I/G_A=(G_I/G_A)G_A I_M \qquad \text{equation 6}$$

Equation 6 indicates that to obtain the ideal amount of power starting from an actual amount with a gain error that is yielded by the system, the actual gain must be multiplied by the factor $(G_I/G_A)$, which is the ratio of the slope of the ideal gain characteristic 804 to the slope of the actual gain characteristic 802. Applying this concept to a preferred embodiment as shown in FIG. 7a $$P_{LMA}=(G_{1A}G_{LA}/R_{1A})V_{REF} \text{ and } P_{LMI}=(G_{1I}G_{LI}/R_{1I})V_{REF} \qquad \text{equation 7}$$

By utilizing the gain compensation technique given in the discussion leading to equation 6, $P_{LMI}=[[(G_{1I}G_{LI}/R_{1I})V_{REF}]/[(G_{1A}G_{LA}/R_{1A})V_{REF}]]P_{LMA}$, and we obtain, $$P_{LMI}=[(G_{1I}G_{LI}/R_{1I})/(G_{1A}G_{LA}/R_{1A})]P_{LMA} \qquad \text{equation 8}$$

Equation 8 indicates that by increasing the gain of the signal $I_{SM}$ by the ratio of the slopes $[(G_{1I}G_{LI}/R_{1I})/(G_{1A}G_{LA}/R_{1A})]$, the corrected gain of the system may be obtained. Using this concept, an approach of the preferred embodiment of the present invention consists of effecting changes in the laser driver amplifier circuit 456 in order to compensate for the gain error. The model also illustrates that there is no need to utilize a costly specialized circuit such as a multiplier to compensate for the error in the slope efficiency of the laser 406 since the preamplifier driver 403 may be utilized for gain compensation. Further, for high frequency applications, only one high frequency circuit is required, namely, the high frequency driver amplifier circuit 456, and a high frequency multiplier is not required. Any time a signal is applied on the high frequency path, the signal is automatically incremented to produce a corresponding laser signal current Is that is free of gain errors.

The circuit compensation for the system gain is realized by changing the value of the gain adjust D/A converter 421, as shown in FIG. 4. The adjusted output changes the effective resistance of the High Frequency Voltage Variable Resistor 415 of the preamplifier 403 until the desired reading of the output power $P_L$ is read on the Optical Power Meter 407. This procedure sets the gain of the high frequency preamplifier 404. An example of a device that may be used to change the gain is a high frequency, digitally controlled gain attenuator such as an AMP-MACOM AT65-0107. The use of this part does not require a gain adjust D/A converter 421. However, because the gain adjustment of this part may be incremented in larger steps, additional components for a feedback circuit may be required depending upon the specific embodiment of the invention. Another alternative for changing the gain is to use a voltage variable absorptive attenuator such as the AT-309 manufactured by AMP-MACOM. These types of devices will operate from DC to several GHz. A combination of resistors and other devices in conjunction with these above-mentioned parts may be needed in the preamplifier circuit in order to obtain a circuit that changes resistance for a control input that may be either an analog voltage or a digital word. The circuit needs to exhibit appropriate high frequency response. Note that during all of the above process, the laser DC bias is maintained at the threshold value $I_{LTH}$. Thus, if the system has not been fully warmed up prior to calibration, depending on the embodiment, there may be a need to re-adjust the low frequency bias current $I_{LTH}$ to the threshold before continuing with the system gain calibration.

Referring again to FIG. 9, step 928 determines and records the resulting preamplifier 403 gain $G_F$ needed to produce a full-scale output of the laser power $P_{LMI}$. When the output power $P_L$ reaches a predetermined value for full-scale output $P_{LMI}$, as indicated by the Optical Power Meter 407, the processor 431 records the value of the gain $G_F$ required to achieve the full-scale signal gain of the system. In the preferred embodiment, the laser output power $P_{LMI}$ is the ideal target output. Once the gain calibration is complete, the subscript "I" may be dropped from the power term, and the equation for the full-scale output power may be written as:

$$P_{LM}=V_{REF}G_FG_{LA}/R_{1A} \qquad \text{equation 9}$$

In step 930, the maximum current $I_{PM}$ through the photodiode 409 is determined for the full-scale laser power $P_{LMI}$ condition. When the output power from the laser 406 is at full scale, the monitoring photodiode 409 should also exhibit a full scale current $I_{PM}$. Because of gain errors in the characteristic of the photodiode 409, the photodiode 409 will yield a value of current that is different from the expected ideal. By the methods described in step 928, and by superposition, the gain adjustment of the photodiode can be made independently of the dark current adjustment. Compensation for the gain error of the photodiode 409 from the characteristic shown in FIG. 7b, is realized in one preferred method by increasing the gain of amplifier 420 by an amount equal to the ratio of the ideal to the actual value of the slope of the photodiode characteristic 708. Accordingly, the gain adjust D/A converter 438 is changed in value by the processor 431. An increment or decrement of the output value of the D/A converter 438 changes the resistance of the voltage variable resistor 412, which, in turn, changes the gain characteristics of the photodiode 409. As the gain is incremented, the photodiode current is monitored until the nominal full-scale value of the photodiode current $I_{PF}$ is obtained. Once the photodiode current $I_{PF}$ is obtained and recorded, all subsequent measurements of power made with the photodiode 409 will be accurate at the measured temperature.

In an alternate embodiment, the gain calibration of the photodiode 409 is accomplished utilizing a fixed resistor in place of the voltage variable resistor 412. This embodiment does not require a gain adjust D/A converter 438, and the photodiode current gain is adjusted by a calculation carried out in the processor 431. This method of gain calibration is more complex, and is used for illustration of the remainder of the method of calibration discussions. Accordingly, to calibrate for gain, the calibration method includes the step of finding a second data point on the photodiode characteristic 708, as shown in FIG. 7b, in order to calculate the photodiode gain. The gain may also be referred to as the effective responsivity $R_{eff}$. When the laser diode 409 produces a full-scale output, the corresponding photodiode current is measured. After subtracting the dark current $I_D$, a value of the maximum photodiode current $I_{PM}$ is obtained. The Optical Power Meter 407 simultaneously reads a value of the maximum power output $P_{LMI}$ of the laser.

As shown in step 932 of FIG. 9, the effective photodiode responsivity $R_{eff}$ of the laser 406 and the photodiode 409 combination is calculated and stored in memory utilizing the equation $$R_{eff}=(P_{LMI}-P_{LTH})/(I_{PM}-I_{PTH}). \qquad \text{equation 10}$$

As illustrated in step 934, the factory calibration process 900 is completed by preparing drift compensation models, storing the models in a processor 431 memory, and disconnecting the optical power meter 407 and host computer 433. In this step all of the parameters previously obtained during calibration, which are needed to compensate for temperature drift, are computed and then stored by the processor 431. Additional parameters previously obtained from the characterization of the laser 406, the photodiode module 409, and the amplifier system are utilized for preparing drift compensation models. These additional parameters, which include drift coefficients, are discussed further the section below entitled "Drift Compensation Methods and Laser Thermal Model".

A first equation utilized for drift compensation models is a threshold compensation formula given by $$I_{LT}(T)=I_{LTH}+D_{TH}(T)\Delta T \qquad \text{equation 11}$$

where $I_{LT}(T)$ is a new laser DC threshold as a function of temperature, and $D_{TH}(T)$ is a function of temperature representing the temperature drift coefficient of the threshold. A gain compensation formula is given by $$G_{F2}(T)=G_F+D_G(T)\Delta T \qquad \text{equation 12}$$

where $G_{F2}(T)$ is a new amplifier gain as a function of temperature, $G_F$ is the gain obtained in the gain calibration, and $D_G(T)$ is a function of temperature representing the temperature drift coefficient of the laser and amplifier gain. A responsivity compensation formula is given by $$R_{effT}=R_{eff}+D_{Reff}(T)\Delta T \qquad \text{equation 13}$$

where $R_{effT}$ is a new responsivity of the photodiode as a function of temperature, $R_{eff}$ is the responsivity obtained in the gain calibration of the photodiode, and $D_{Reff}(T)$ is a function of temperature representing the temperature drift coefficient of the photodiode gain.

The calibration parameters as well as the parameters related to the thermal model are stored in the memory of the processor 431. The final step of the factory calibration process 900 includes disconnecting the optical power meter 407 and host computer 433 from the laser drive control system 460. No further use of this equipment is required unless there is a need to re-calibrate the system due to significant aging degradation of the laser 406 or laser diode 409.

b. A Power Up Calibration and Initialization Process

FIG. 10 illustrates the power up calibration and initialization process 950 utilized with an electro-optic system as shown in FIG. 4 in accordance with a preferred embodiment of the present invention. During power up, the laser drive control system 460 utilizes the equations and the obtained calibration parameters of the factory calibration process 900. The laser drive control system 460 also utilizes the drift compensation models discussed below.

The steps of the power up calibration and initialization process 950 are similar to the steps used in the factory calibration process 900. Thus, the discussions of the preferred embodiment of this method focus on the method steps which have not been introduced in the factory calibration process 900. Referring to FIG. 10, step 952 sets the preamplifier gain is to the full-scale signal gain $G_F$ of the system that was obtained during factory calibration. Because the gain $G_F$ also produces gain for an offset of the amplifier 403, a representative value of the offset for the amplifier 403 must be obtained to eliminate the offset. In step 954, the input of preamplifier 403 is connected to circuit ground 450 using the Test System Switch (TSS) 402. This step connects zero volts to the input of the preamplifier 403. In step 956, the DC bias current $I_L$ for the laser 406 is turned off. The method continues by cancelling the offset voltage of the preamplifier 403, step 958, and reading and recording the dark $I_D$ current for the photodiode 409, step 960. In step 962, the temperature T of the laser module 406 is read utilizing an output of the temperature sensor 408.

Continuing with FIG. 10, step 964 starts the process to determine laser threshold current $I_{LTH}$ by gradually increment the DC bias current $I_L$ for the laser 406. The photodiode current $I_{P1}$ is measured via a path through an amplifier 420 to a multiplexer 435 that is coupled to the processor 431 by means of an A/D converter 432. In a next step 966, the laser power $P_L$ is computed using the equation $$P_L = (I_{P1} - I_D) R_{effT} \qquad \text{equation 14}$$

Equation 14 first subtracts the dark current $I_D$ from the measured photodiode current $I_{P1}$ and multiples the result by the effective responsivity over temperature $R_{effT}$ obtained in step 934 using equation 13 of the factory calibration. In step 968 of the power up calibration and initialization method 950 of a preferred embodiment, the DC bias current $I_L$ is set to threshold by selecting a point of $I_L$ at which $dP_L/dI_L$ stops changing. The laser power $P_L$ is determined at the DC bias current threshold $I_{LTH}$, as shown in step 970, by first reading the corresponding photodiode current $I_{PT}$, subtracting the dark current, and computing the corresponding power utilizing equations 15 and 16 as follows:

$$I_{PTH} = I_{PT} - I_D \qquad \text{equation 15}$$

$$P_{LTH} = (I_{PTH} - I_D) R_{effT} \qquad \text{equation 16}$$

The threshold current $I_{PTH}$ of the photodiode 409 and the threshold output power $P_{LTH}$ of the laser 406 are recorded in the processor memory 431 in step 972.

Continuing, step 974 of the power up calibration and initialization 950 includes determining and recording the temperature of laser module $T_{TH}$ at the threshold condition. This step assumes that the laser 406 is warmed-up to stabilize its operating temperature. Depending upon the laser characteristics of a specific embodiment implemented utilizing the method of the present invention, a wait time may be required in this step.

Step 976, as shown in FIG. 10, represents the start of the system gain calibration procedure. The Test System Switch 402 is switched from circuit common 450 to a voltage reference $V_{REF}$ 428 generated by a signal generator 427 to simulate a full scale input signal 401. In step 978, the corresponding photodiode current $I_{PM}$ is determined for above full-scale voltage reference $V_{REF}$. In steps 980 through 984, a corresponding laser power output $P_{LMA}$ is determined using the photodiode equation 14. The processor 431 compensates for gain errors by incrementing gain $G_1$ of preamplifier 403 while determining laser power output $P_L$ utilizing photodiode measurements. The gain $G_F$ needed to obtain full-scale output of laser power $P_{LM}$ is determined and recorded.

In steps 986 and 988, the reference voltage is disconnected from the preamplifier input 402, and reconnected to the circuit ground 450. Continuing with the preferred method in step 990, the DC bias current $I_L$ is set to the operating point utilizing the measurement circuit comprised of sense resistor R6 (429), an amplifier of the sensing amplifiers 436, the multiplexer 435, and the A/D converter 432 that is connect to the processor 431. The DC bias operating point is given by the equation $$I_{LQ} = I_{LTH} + \Delta_{LTH} \qquad \text{equation 17}$$

wherein the DC bias operating point $I_{LQ}$, also referred to as the "Q point", is set at a value above the laser threshold current $I_{LTH}$. The exact bias is dependent upon the specific use of components. For digital applications of the Electro-Optic System Controller of the present invention, $\Delta_{LTH}$ includes a sufficient margin of error to prevent operation near the threshold level region which is nonlinear and exhibits a relatively high level of noise. The margin $\Delta_{LTH}$ called here "threshold margin" allows the laser 406 to operate in the target region even when there are small changes in temperature between calibrations.

For analog applications of the Electro-Optic System Controller of the present invention, $\Delta_{LTH}$ contains an additional biasing term in addition to the previous threshold margin as discussed above. This second term is defined as the "range bias". The range bias will send the DC operating point $I_{LQ}$ to a location near the center of the laser characteristic for the laser in order to maximize the dynamic range and the signal to noise ratio. For digital applications of the Electro-Optic System Controller, an equivalent equation to equation 17, but given in terms of power is:

$$P_{LQ} = P_{LTH} + \Delta P \qquad \text{equation 18}$$

The term $\Delta P$ is the amount of laser power that corresponds to the threshold margin. For analog applications of the Electro-optic System Controller, an equivalent equation to equation 17, but given in terms of power is:

$$P_{LQ} = P_{LTH} + (P_{LM} - P_{LTH} - 2\Delta P)/2 \qquad \text{equation 19}$$

where $P_{LM}$ is the maximum laser power that can be utilized for a specific laser. The term $2\Delta P$, called here "power margin", provides a margin to avoid operation near both extreme ends of the laser characteristic. This margin ensures that the maximum power capability of the laser is not exceeded and that the laser does not operate near the threshold. In addition, the laser characteristic may become nonlinear in the maximum power region, especially as the laser ages. Equation 18 provides the margins to avoid operating near threshold in the case of applications of the drive controller such as digital signal transmission. Equation 19 provides margins to avoid operating near threshold, and to maximize signal to noise ratio for analog applications such as analog signal transmission.

Continuing with the power up calibration and initialization 950 method of FIG. 10, the system computes drift compensation parameters in step 992. In addition, the slope efficiency of the transfer characteristic $G_{LA}$ is computed and stored to monitor any degradation of the laser 406. The system also prepares drift compensation equations as discussed below. The compensation parameters are stored in the processor 431 memory.

In the final step 994 of the power up calibration and initialization method 950, the processor 431 sends control signals to reconfigure the system test switch 402 to connect the input of the preamplifier 403 to the signal driving the laser 401. This marks the end of the power up calibration and initialization process 950 of a preferred embodiment of the present invention, and the electro-optic system 230, 240 is ready for use.

c. Drift Compensation and Laser Thermal Model

Figure 11:
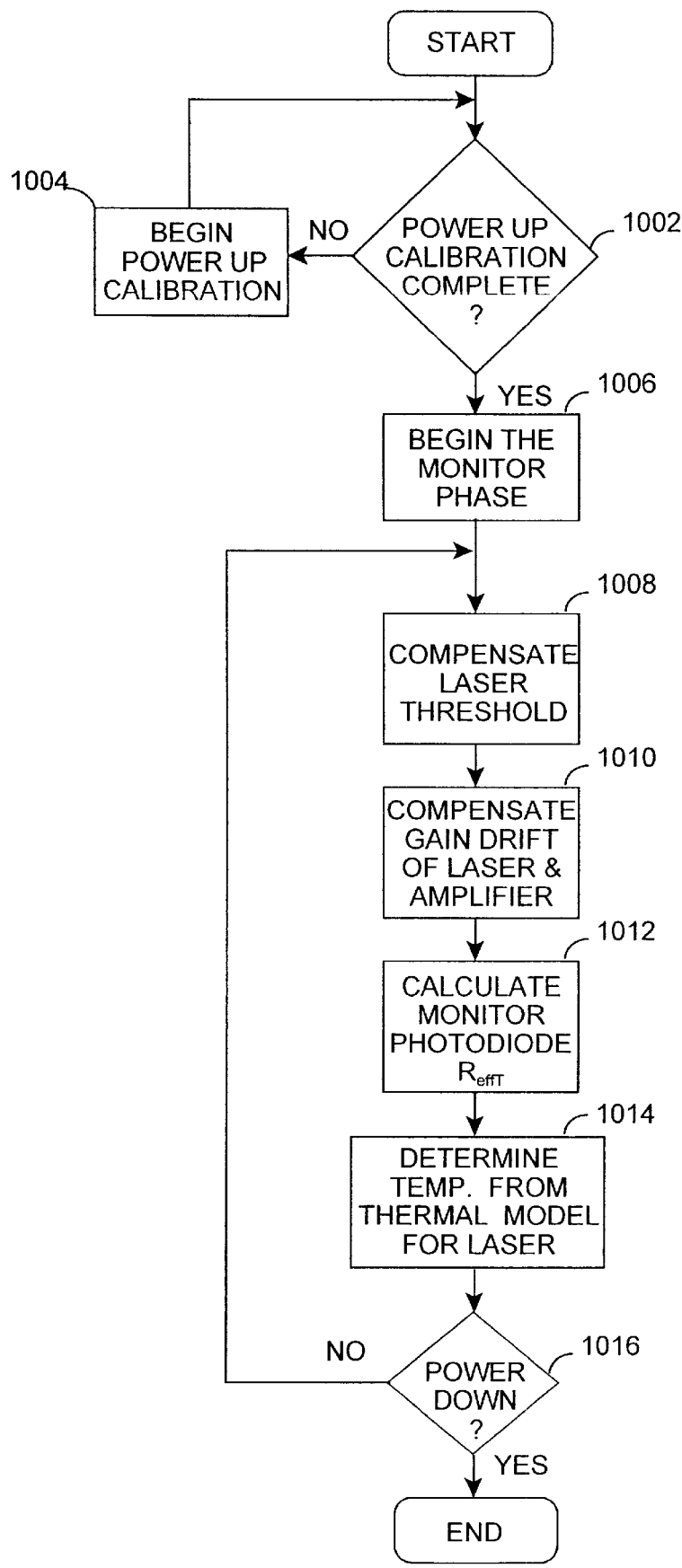
FIG. 11 illustrates the monitor phase of one embodiment of the present invention.

Referring to FIGS. 4 and 11, upon completion of the power up calibration and initialization process 1002, the electro-optic system enters a monitor phase 1006. During the monitor phase 1006, the laser drive control system 460 performs drift compensation utilizing drift models, and determines how to adjust critical controller circuit parameters. The temperature of the laser 406 is monitored for any changes that require re-adjustment of critical system parameters such as laser DC bias $I_L$ or system gain. Drift compensation is performed in a continuous manner, and without the need to disconnect the electro-optic system 230, 240 from the input signal 401. The method determines the adjustments with the use of drift models, and then changes the system parameters, as needed, utilizing very gradual steps that emulate analog drift. A key advantage of the compensation method of the present invention is that the compensation adjustments are made without taking the laser off-line or connecting any equipment.

There are several types of drift compensation methods carried out by the system during the monitoring phase 1006 including laser threshold drift compensation 1008, amplifier and laser gain drift 1010 compensation, and photodiode effective responsivity drift compensation 1012. In addition, a thermal model 1014 for the laser 406 determines whether the temperature has changed by a significant amount, requiring compensation of the laser 406 parameters. The monitor phase continues as long as the electro-optic system 230, 240 is operating 1016.

1. Laser Threshold Drift Compensation

The formula used for laser threshold drift compensation 1008 is given by:

$$I_{LTH2} = I_{LTH} + D_{TH}(T)\Delta T \qquad \text{equation 20}$$

where $I_{LTH2}$ is a new laser DC bias, $D_{TH}(T)$ is a function of temperature representing the temperature drift coefficient of the bias current, $I_{LTH}$ is the laser current threshold calculated at the last power up calibration, and $\Delta T$ is the change in temperature from the value at the power up calibration of the threshold current. The drift coefficient $D_{TH}(T)$ is the best-suited approximation to the drift behavior of the laser, and may be a polynomial, a constant or a set of data points stored in the processor memory 431.

Referring to FIG. 4, in one embodiment of the present invention, the laser bias current adjustments are made utilizing the bias adjustment D/A converter 425 that is a 12-bit D/A converter with a 5V reference voltage. This device provides a resolution of $\Delta V = 5V/2^{12} = 1.22$ mV/count. If the low frequency VCCS uses a 10Ω resistor R7 (430), then the device has a resolution of $\Delta I = \Delta V/10\Omega = 0.122$ mA/count. In one embodiment of the laser bias current adjustment circuit, the bias adjustment D/A converter 425 is a DAC1218 manufactured by National Semiconductor. For a laser diode 409 such as the ML3XX1 made by Mitsubishi, the drift of the threshold current is specified as 0.317 mA/° C. Therefore, to make an adjustment for a 1° C. change in temperature, the bias adjust D/A converter word must be adjusted by approximately 2 counts.

For a specific implementation requiring a relatively high adjustment resolution and accuracy, it is possible to use a 16-bit D/A converter with a 5V reference. This device provides a resolution of $\Delta V = 5V/2^{16} = 76.29$ μV/count. If the low frequency Voltage Controlled Current Source uses a value of 100Ω for resistor R7 (430), then a resolution of $\Delta I = \Delta V/100\Omega = 0.763$ μA/count is obtained. Utilizing this device, a 1° C. change in temperature may be compensated in approximately 415 steps. Because the current adjustment capability is of such high resolution, the offset current drift may be continuously adjusted in a manner that simulates analog drift without taking the laser system out of operation.

2. Gain Drift of Amplifier and Laser

The formula used to compensate for gain drift of the amplifier (1010) and laser is given by:

$$G_{F2}(T) = G_F + D_G(T)\Delta T \qquad \text{equation 21}$$

where $G_{F2}(T)$ = new amplifier gain as a function of temperature, $G_F$ is the preamplifier gain obtained in the gain calibration, $D_G(T)$ is a function of temperature representing the temperature drift coefficient of the gain for both the laser and the preamplifier. The drift coefficient is the best-suited approximation to the drift behavior of the total gain for the amplifier and laser; it can be a general equation, a polynomial, a constant or a set of data points stored in the Processor memory 431.

As an example, for the laser diode ML2XX1 made by Mitsubishi, the drift of the laser gain (slope efficiency) is specified as −0.0028 mW/mA/° C. For the preamplifier, a significant contributor to the gain of amplifiers is the drift of the resistors that determine the gain. For high performance amplifiers, the drift for the gain can be typically 0.01% per degree C. For some applications, these factors, along with the drift of the gain adjust circuits, may be combined into a single constant drift coefficient for the gain. Also, for this specific embodiment, a high resolution D/A converter may be used to adjust for the gain drift without taking the laser system out of operation.

3. Photodiode Effective Responsivity Drift

Although in many applications the photodiode drift can be neglected, there may be some instances in which a correction for the drift of the effective responsivity of the photodiode 1012 is needed. Correction can be performed utilizing the equation:

$$R_{effT} = R_{eff} + D_{Reff}(T)\Delta T \qquad \text{equation 22}$$

where $R_{effT}$ is a new photodiode effective responsivity as a function of temperature, $R_{eff}$ is the photodiode effective responsivity obtained in the gain calibration, and $D_{Reff}(T)$ is a function representing the drift as a function of temperature. The $D_{Reff}(T)$ function may be a polynomial, a constant or a set of data points stored in the processor memory 431.

4. Thermal Model

A thermal model 1014 equation may represent the laser temperature in terms of the characteristic thermal resistances of the mechanical system that comprises the laser module 406. An example of this equation is $$T_J = T_S + P_L(\theta_{JC} + \theta_{CSH} + \theta_{HS}) \qquad \text{equation 23}$$

where $T_J$ is the laser junction temperature, $T_S$ is the sensor temperature, $P_L$ is the laser power, $\theta_{JC}$ is the laser junction to laser case thermal resistivity, $\theta_{CSH}$ is the thermal resistivity of the laser case to the laser module holder/heat sink, and $\theta_{HS}$ is the thermal resistivity from the heat sink to the sensor. Methods for determining laser thermal resistance are disclosed by Mitsubishi Corporation in the "Optical Semiconductor Devices and Optical Fiber Communication Systems" data book. Temperature sensors with a wide variety of precision may be utilized to determine laser temperature. Temperature sensors include, but are not limited to, sensors that are part of an integrated circuit, which includes the temperature sensor and the laser in the same integrated circuit. Other more complex thermal arrangements for mechanical systems involving the laser may be modeled in a similar manner with more complex thermal circuit models. These models are then characterized for a given design to determine the values of the parameters.

Variation of the calibration methods presented may be utilized depending on the constraints for a specific application. Depending upon the specific implementation of an embodiment of the present invention, the power up calibration and initialization processes 950 described above may need to insert wait times to allow for the laser 406 to warm-up to a stable temperature The present invention has been described with reference to specific embodiments. Embodiments such as utilizing similar calibration techniques to control and stabilize the wavelength emitted by the laser are possible. Other embodiments will be apparent to those skilled in the art in view of the foregoing description. It is therefore intended that this invention not be limited except as indicated by the appended claims.

I claim:

1. A photodetector circuit for subtracting a current error from an optical signal current, the photodetector circuit comprising:
   a first photo detector coupled through a first load line resistor to a summing junction of an amplifier, the first photo detector for receiving the optical signal current, wherein the first photo detector is reverse biased such that the optical signal current flows into the summing junction;
   a second photo detector matched to the first photo detector and coupled through a second line resistor to the summing junction, the second photo detector biased such that a second signal current flows out of the summing junction; and
   the amplifier for converting the optical signal current and the second signal current to a voltage, and for providing the summing junction with a virtual ground.

2. The photodetector circuit of claim 1, wherein the second signal current approximates the current error of the optical signal.

3. The photodetector circuit of claim 1, wherein the current error is a dark current of the first photo detector.

4. The photodetector circuit of claim 1, wherein the current error is an aging current from an aging of the first photo detector.

5. The photodetector circuit of claim 1, wherein the first load line resistor has a resistance in the tens of ohms.

6. A circuit for calibrating a photodiode, the circuit comprising:
   a photodetector coupled through a load line resistor to a summing junction of an amplifier;
   an analog to digital converter connected to the amplifier for accepting measurement signals from the photodetector and converting the measurement signals to a digital measurement signal; and
   a processor for accepting the digital measurement signal, the processor having means for subtracting a dark current value from the digital measurement signal.

7. The circuit of claim 6, wherein the dark current value is obtained utilizing an external Optical Power Meter during an initial calibration process.

8. The circuit of claim 6, wherein the load line resistor is less than 100 ohms.

9. A method for calibrating a photodiode, the method comprising the steps of:
   coupling a photodiode to an amplifier;
   converting an analog signal from the amplifier into a digital signal; and
   utilizing digital circuitry to subtract a pre-defined compensation value from the digital signal.

10. A method for calibrating a photodiode as in claim 9, wherein the pre-defined compensation value is representative of a dark current obtained from measuring a signal output of the photodiode during a no-light condition.

11. A circuit for calibrating a photodiode for monitor light power of a laser diode, the circuit comprising:
   a power sense measurement circuit for sensing a threshold power level $P_{LTH}$ of the laser diode and a second power level $P_{LM}$;
   the photodiode coupled through a load line resistor to a summing junction of an amplifier;
   an analog to digital converter connected to the amplifier for accepting a threshold photodiode current $I_{PTH}$ at the threshold power level $P_{LTH}$ and a second photodiode current $I_{PM}$ at the second power level $P_{LM}$, the analog to digital converter for converting the threshold and second photodiode currents to an initial and second digital measurement signal; and
   a processor for accepting the initial and second digital measurement signals and the threshold and second power levels, the processor for calculating an effective responsivity $R_{eff}$ of a photodiode module comprising the laser diode and the photodiode according to the equation $R_{eff}=(P_{LM}-P_{LTH})/(I_{PM}-I_{PTH})$.

12. A circuit for calibrating a photodiode as in claim 11, wherein the processor accounts for circuit errors in the circuit utilizing two data points comprising a third and a fourth photodiode current to determine a characteristic of the photodiode defined by the third and the fourth photodiode currents versus a third and a fourth power level corresponding the third and the fourth photodiode currents.

13. An electro-optic control system apparatus comprising:
   a laser module having inputs comprising a low frequency DC bias current and a signal current;
   a photodetector circuit for monitoring the laser module, the photodetector circuit having means for compensating for dark current;
   a temperature sensor coupled to the laser module;
   a low frequency VCCS circuit for driving the low frequency DC bias current;
   a high frequency VCCS circuit for driving the signal current;
   an amplifier connected to the high frequency VCCS circuit, the amplifier having adjustable offset and gain;
   a test system switch for connecting a plurality of input signals to the amplifier, the plurality of signals comprising calibration signals;
   a plurality of digital to analog converters for providing control voltages comprising:
      offset and gain control voltages for controlling the amplifier; and
      low frequency VCCS control voltages for controlling the low frequency DC bias current;
   a plurality of analog to digital converters for providing a digital representation of analog variables comprising laser temperature, photodiode current, laser current, and laser voltage; and
   a controller comprising at least one integrated circuit, the controller having at least one input coupled to the plurality of analog to digital converters, and at least one output couple to the plurality of digital to analog converters, the controller utilizing the at least one input and at least one output for controlling the electro-optic control system.

14. The electro-optic control system apparatus of claim 13, wherein the high frequency VCCS drives the laser signals utilizing one of DC, AC, high frequencies, microwave, and a signal that is modulated in frequency amplitude.

15. The electro-optic control system apparatus of claim 13, wherein the calibration signals characterize one of signal to noise ratios and bit error rates.

16. The electro-optic control system apparatus of claim 13, wherein the plurality of digital to analog converters are pulse width modulators.

17. The electro-optic control system apparatus of claim 13, wherein the control voltages further comprise tuning voltages for tuning a laser wavelength.

18. The electro-optic control system apparatus of claim 13, wherein the control voltages further comprise heater-cooler controls to maintain a laser temperature.

19. The electro-optic control system apparatus of claim 13, wherein the control voltages further comprise motion control voltages for moving mirrors or other mechanical devices used to tune the laser.

20. The electro-optic control system apparatus of claim 13, further comprising at least one isolation resistor and high impedance amplifiers for detecting a laser voltage and current without affecting the laser low frequency DC bias current or frequency response of the high frequency VCCS.

21. The electro-optic control system apparatus of claim 13, further comprising a set of high impedance amplifiers for measuring a laser voltage, the low frequency DC bias current and the signal current.

22. The electro-optic control system apparatus of claim 13, wherein the controller is an application specific integrated circuit (ASIC) with mixed signal IC processes-for accommodating analog and digital devices.

23. The electro-optic control system apparatus of claim 13, wherein the controller further comprises:
   a microcontroller;
   non-volatile read-write storage; and
   at least one signal generator.

24. The electro-optic control system apparatus of claim 13, wherein the controller further comprises a code detector circuit for sensing a serial data stream input.

25. The electro-optic control system apparatus of claim 13, further comprising:
   an input protection circuit for protecting the input of the electro-optic control system from over voltages, power surges and electrostatic discharge.

26. A laser control system having a laser with a driver input, the laser control system comprising:
   a first branch connected to the driver input, the first branch comprising low frequency integrated circuits for driving DC current to set a laser operating point;
   a second branch connected to the driver input comprising high frequency circuits for driving a signal to be transmitted, wherein the signal to be transmitted is one of an AC signal, a DC signal, and a combination signal.

27. The laser control system of claim 26, wherein the first branch is driven from a low frequency current source and the second branch is driven from a high frequency current source.

28. The laser control system of claim 26, wherein the second branch is a signal path further comprising at least one amplifier.

29. The laser control system of claim 28, wherein the at least one amplifier has a frequency response in the range of many Ghz.

30. A method for setting a laser threshold of a laser, the method comprising the steps of:
   coupling a photodiode through a load line resistor to a summing junction of an amplifier;
   converting an analog signal from the photodiode into a digital signal;
   subtracting a pre-defined compensation value from the digital signal;
   measuring a laser output power $P_L$ as a laser bias current $I_P$ is changed;
   calculating a derivative $dP_L/dI_P$;
   identifying a laser threshold current $I_{TH}$ in a region of linear operation of the laser, wherein the threshold current is a point at which the derivative $dP_L/dI_P$ has reached a stable value after changing in a transition region between spontaneous emission and stimulated emission; and
   setting the laser bias current $I_P$ to an operating point current $I_{LQ}$ above laser threshold current $I_{TH}$ by utilizing the analog signal from the photodiode as a feedback according to the equation $I_{LQ}=I_{TH}+\Delta_{IL}$, where $\Delta_{IL}$ comprises a margin to prevent operation below the threshold current.

31. The method for setting a laser threshold as in claim 30, wherein $\Delta_{IL}$ comprises a margin to prevent the operating point current $I_{LQ}$ from entering a region adjacent the laser threshold current between temperature adjustments.

32. The method for setting a laser threshold as in claim 30, wherein $\Delta_{IL}$ further comprises an additional term for centering the operating point current $I_{LQ}$ to provide a maximum dynamic range and signal to noise ratio.

33. A circuit for compensating for a slope efficiency of a laser having a driver input, the circuit comprising:
   a processor for outputting a plurality of control signals, the processor having a plurality of measurement inputs and a storage means;
   a signal amplifier for amplifying a signal to the driver input of the laser;
   a D/A converter connected to a variable resistor for setting a gain of the signal amplifier, the D/A converter receiving at least one resistor control signal of the plurality of control signals from the processor;
   a lookup table in the storage means in the processor, the lookup table for relating the at least one resistor control signal to a resistance, the lookup table for storing expected predetermined slope efficiencies, amplifier gains, and at least one predetermined laser output power;
   a laser bias circuit connect to the driver input of the laser, the laser bias circuit set to a threshold current; and
   a means for measuring an actual value of laser output power connected to a measurement input of the plurality of measurement inputs of the processor;
   wherein the processor sends the at least one resistor control signal to the D/A converter to change the gain of the signal amplifier until the at least on predetermined laser output power is obtained for the threshold current.

34. The circuit for compensating for a slope efficiency of a laser as in claim 33, wherein the variable resistor for setting a gain of the signal amplifier is a high frequency digitally controlled resistor.

35. The circuit for compensating for a slope efficiency of a laser as in claim 33, further comprising a reference voltage signal amplifier for applying a reference voltage at the input of the signal amplifier.

36. A method for continuous compensation of laser current threshold variations due to a plurality of temperature changes of a laser, the method comprising the steps of:
   recording an initial value of threshold current $I_{LTH}$ upon power up or after calibration of the laser;
   recording a corresponding value for the laser temperature $T_1$ at the initial value of threshold current $I_{LTH}$;
   recording a changed temperature $T_2$ of the plurality of temperature changes;
   calculating an adjustment to the threshold current using the formula $I_L=I_{LTH}+D_{TH}(T)\Delta T$, where $I_L$ is an adjusted laser DC bias current, where ΔT is a temperature change between $T_1$ and $T_2$, where $D_{TH}(T)$ is a function of temperature representing a temperature drift coefficient of a bias current of the laser, the temperature drift coefficient approximating a drift behavior of the laser; and setting a Voltage Controlled Current Source to output the adjusted laser DC bias current;

wherein the adjusted laser DC bias current is changed in a gradual manner so as to emulate a temperature drift.

37. The method for continuous compensation of laser current as in claim 36, wherein the temperature drift coefficient for approximating a drift behavior of the laser is one of a polynomial, a constant or a set of data points.

38. A method for continuous compensation of laser gain drift of a laser and a signal amplifier due to variations in temperature, the method comprising the steps of:

recording an initial gain $G_1$ of the signal amplifier and an initial gain $G_L$ of the laser during a calibration process;

recording a corresponding initial temperature $T_1$ of the laser;

continuously monitoring the laser for changes in temperature to a second temperature $T_2$;

calculating a new gain using the formula $G_2=G_1+G_1 D_{G1GL}(T)\Delta T$ where $G_2$ is an second amplifier gain at the second temperature $T_2$, $D_{G1GL}(T)$ is a function of temperature representing a temperature drift coefficient of the laser and the amplifier gain, where ΔT is a temperature change between $T_1$ and $T_2$; and utilizing a high frequency variable resistor and a high resolution D/A converter to change the initial gain $G_1$ of the signal amplifier to the second amplifier gain $G_2$;

wherein changing the initial gain $G_1$ to the second amplifier gain $G_2$ is gradual so as to emulate a temperature drift.

39. A circuit for determining laser temperature $T_J$ of a laser module comprising:

a means for measuring a temperature $T_S$ of a sensor thermally coupled to the laser module;

a high impedance circuit for measuring a voltage $V_{LD}$ across the laser;

a high impedance circuit for measuring a signal current $I_{LS}$ driving the laser;

a means for calculating a DC bias current $I_{LQ}$ driving the laser;

a processor for approximating an instantaneous power $P_L$ of the laser, where $P_L=V_{LD}(I_{LQ}+I_{LS})$, and an average calculation of power is obtained by averaging data taken in periodic samples; and calculating the temperature $T_J$ using an equation representing the laser temperature in terms of the instantaneous power $P_L$, temperature $T_S$, and characteristic thermal resistances of the mechanical system that comprises the laser module.

40. The circuit for determining laser temperature of a laser module as in claim 39, wherein the equation representing the laser temperature is $T_J=T_S+P_L(\theta_{JC}+\theta_{CSH}+\theta_{HS})$, where the thermal resistances are predetermined by characterization of the laser module to approximate a drift behavior of the laser module.

41. The circuit for determining laser temperature of a laser module as in claim 40, wherein the thermal resistances are one of a polynomial, a constant, and a set of data points.

42. A circuit for eliminating offset of an amplifier for a laser signal driver of a laser, comprising:

a drive controller;

a D/A converter controlled by the drive controller and connected to a summing junction of the amplifier;

a resistor for applying an offset voltage to the summing junction;

a test system switch for providing a common connection to the amplifier; and a means for measuring an offset of the amplifier utilizing a spontaneous emission from an output of the laser;

wherein the D/A converter applies current to the summing junction to cancel the offset of the amplifier.

43. The circuit of claim 42, wherein the means for measuring the offset is an external Optical Power Meter.

44. The circuit of claim 42, wherein the means for measuring the offset is a photodetector.

45. A method for calibrating a gain of a laser and amplifier driver circuit, comprising the steps of:

providing an input voltage reference to the amplifier driver circuit;

calibrating the gain for the laser and amplifier driver circuit utilizing the input voltage;

detecting a change in a slope efficiency of the laser due to aging; and compensating for the aging of the laser using the change of the slope efficiency.

46. An electro-optic control system apparatus comprising:

a laser module having inputs comprising a low frequency DC bias current and a signal current;

a photodetector circuit for monitoring the laser module, the photodetector circuit having means for compensating for dark current;

a temperature sensor coupled to the laser module;

a low frequency VCCS circuit for driving the low frequency DC bias current;

a high frequency VCCS circuit for driving the signal current;

an amplifier connected to the high frequency VCCS circuit, the amplifier having adjustable offset and gain;

a test system switch for connecting a plurality of input signals to the amplifier, the plurality of signals comprising calibration signals;

a plurality of digital to analog converters for providing control voltages comprising:

offset and gain control voltages for controlling the amplifier; and low frequency VCCS control voltages for controlling the low frequency DC bias current;

a plurality of analog to digital converters for providing a digital representation of analog variables comprising laser temperature, photodiode current, laser current, and laser voltage;

a controller comprising at least one integrated circuit, the controller having at least one input coupled to the plurality of analog to digital converters, and at least one output couple to the plurality of digital to analog converters, the controller utilizing the at least one input and at least one output for controlling the electro-optic control system; and an input protection circuit coupled to the amplifier for protecting the electro-optic control system from over voltages, power surges and electrostatic discharge on a signal current input.

* * * * *

UNITED STATES PATENT AND TRADEMARK OFFICE
CERTIFICATE OF CORRECTION

PATENT NO. : 6,629,638 B1 Page 1 of 1
APPLICATION NO. : 09/724692
DATED : October 7, 2003
INVENTOR(S) : Jorge Sanchez It is certified that error appears in the above-identified patent and that said Letters Patent is hereby corrected as shown below:

In the specification of the patent:

Column 8, line 52, remove "Ser. No. 09/772,709"

and replace with --Ser. No. 09/472,709--

Signed and Sealed this

Fourteenth Day of October, 2008

JON W. DUDAS
*Director of the United States Patent and Trademark Office*